(12) United States Patent
Ribeiro et al.

(10) Patent No.: US 10,168,159 B2
(45) Date of Patent: Jan. 1, 2019

(54) MAGNETOMETER ARRAYS FOR INERTIAL NAVIGATION, MAPPING, AND DRIFT COMPENSATION

(71) Applicant: Microsoft Technology Licensing, LLC, Redmond, WA (US)

(72) Inventors: Flavio Protasio Ribeiro, Bellevue, WA (US); Anatoly Churikov, Henderson, NV (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 179 days.

(21) Appl. No.: 14/864,675

(22) Filed: Sep. 24, 2015

(65) Prior Publication Data
US 2017/0089706 A1    Mar. 30, 2017

(51) Int. Cl.
| | |
|---|---|
| *G01C 9/00* | (2006.01) |
| *G01C 21/20* | (2006.01) |
| *G01R 33/10* | (2006.01) |
| *G06F 17/16* | (2006.01) |
| *G06K 9/00* | (2006.01) |

(52) U.S. Cl.
CPC ........... *G01C 21/20* (2013.01); *G01C 21/206* (2013.01); *G01R 33/10* (2013.01); *G06F 17/16* (2013.01); *G06K 9/00* (2013.01); *G06K 9/00342* (2013.01)

(58) Field of Classification Search
CPC ............................. G01C 21/20; G01C 21/206
USPC ........................................................ 702/150
See application file for complete search history.

(56) References Cited

U.S. PATENT DOCUMENTS

| | | | |
|---|---|---|---|
| 5,629,626 | A | 5/1997 | Russell et al. |
| 6,958,929 | B2 | 10/2005 | Abraham et al. |
| 7,443,154 | B1 | 10/2008 | Merewether et al. |
| 2005/0194973 | A1 | 9/2005 | Kwon et al. |
| 2013/0245984 | A1* | 9/2013 | Sheng ................ G01R 33/0035 702/94 |

FOREIGN PATENT DOCUMENTS

| | | |
|---|---|---|
| CN | 103363988 | 10/2013 |
| EP | 2602590 | 6/2013 |
| EP | 2615420 | 7/2013 |

(Continued)

OTHER PUBLICATIONS

Gozick et al., "Magnetic Maps for Indoor Navigation," *IEEE Trans. on Instrumentation and Measurement*, vol. 60, No. 12, pp. 3883-3891 (Dec. 2011).

(Continued)

*Primary Examiner* — Anthony Ho
(74) *Attorney, Agent, or Firm* — Klarquist Sparkman, LLP

(57) ABSTRACT

Examples of arrays of magnetometers that can be used as or as part of an inertial measurement unit (IMU) are disclosed herein. Various methods for using such arrays in order to obtain highly precise and locationally unique data, which can be used to correct for drift effects, are also disclosed. In certain embodiments, the Jacobian matrix of the magnetic field is computed from the magnetometer measurements. This Jacobian matrix data can be used to generate a magnetic field map for a particular environment and/or to locate position, velocity, and acceleration of the IMU by referencing such a magnetic field map.

20 Claims, 12 Drawing Sheets

(56) References Cited

FOREIGN PATENT DOCUMENTS

WO    WO 2013/160286    10/2013

OTHER PUBLICATIONS

International Search Report and Written Opinion dated Jan. 3, 2017, from International Patent Application No. PCT/US2016/052242, 12 pp.
Vissière et al., "Using distributed magnetometers to increase IMU-based velocity estimation into perturbed area," *IEEE Conf. on Decision and Control*, pp. 4924-4931 (Dec. 2007).
Vissière et al., "Using magnetic disturbances to improve IMU-based position estimation," *Proc. of European Control Conf.*, pp. 2853-2858 (Jul. 2007).

* cited by examiner

MAGNETOMETER ARRAYS FOR INERTIAL NAVIGATION, MAPPING, AND DRIFT COMPENSATION

FIELD

This application relates to inertial measurement units (IMUs) and, more specifically, to magnetometer arrays for use in IMUs.

BACKGROUND

In general, an inertial measurement unit (IMU) is a system that detects linear and angular motion and produces data that can be used to determine the position, velocity, and orientation of the IMU or of the device (or vehicle) to which the IMU is attached. IMUs typically operate using a combination of one or more accelerometers and gyroscopes. The measurements made by the components of an IMU often include some degree of error. Thus, when the IMU is used to measure movement and orientation over a period of time, the measurement errors can accumulate and compound themselves as the time period of measurement lengthens. Consequently, the IMU will report increasingly inaccurate movement or orientation data. This effect is commonly referred to as "drift" or "IMU drift".

As IMUs are increasingly used in a variety of applications (including vehicle navigation, autonomous device navigation (e.g., robots and drones), and virtual reality applications (e.g., gaming applications that use a virtual reality headset), there is a growing need for IMU systems that are both highly accurate and have robust drift compensation mechanisms. Further, IMUs desirably are capable of being used in a variety of environments or conditions, including indoor environments (e.g., a building or other structure having surrounding walls and a ceiling).

SUMMARY

In summary, the detailed description presents examples of arrays of magnetometers that can be used as or as part of an inertial measurement unit (IMU). The detailed description also presents various methods for using such arrays in order to obtain highly precise and locationally unique data. Such data can be used to correct for drift effects that are present in many IMU systems. In certain embodiments, the Jacobian matrix of the magnetic field is computed from the magnetometer measurements. This Jacobian matrix data produces highly differentiated and distinct data, especially for indoor environments where non-uniform magnetic fields exist. The Jacobian matrix data can then be used to generate a magnetic field map (a volumetric map) for a particular indoor environment and/or to locate position, velocity, and acceleration of the IMU within that environment by referencing such a magnetic field map.

For example, in certain embodiments, magnetic field measurements from a magnetometer array are used to create a map of the magnetic vector field and magnetic vector field Jacobian for a particular environment (e.g., an indoor environment, such as within a building or other structure having surrounding walls and a ceiling). The magnetic vector data and its associated Jacobian data (potentially along with some data indicating IMU movement) can alone be used for map construction without any reliance on other positional determination mechanisms (e.g., visual mechanisms). Thus, map construction is greatly simplified and the need for supplemental positional determination during map construction is obviated.

In some embodiments, a constructed map of magnetic field values and their associated Jacobian values is used with one or more magnetometers for navigation. For instance, the map can be used with one or more magnetometers for localization (location fingerprinting) by: traversing a path while recording (i) the variations of magnetic field measured by magnetometers of the array and (ii) the path traveled (estimated by the IMU using dead reckoning, potentially with filtered data (e.g., with a Kalman filter)); and finding which corresponding path in the map has the highest correlation with the observed magnetic measurements. The confidence in the location estimate can increase with the length of the path and/or with the variability of the magnetic field.

In particular embodiments, external magnetic field generators (e.g., inductors with a prescribed excitation or permanent magnets) are used to create intentional disturbances in the magnetic field, in combination with any of the techniques disclosed herein.

Still further, in some embodiments, dynamic activation/deactivation of a gyroscope is performed by comparing a metric of magnetic field variability (e.g., the condition number of the Jacobian matrix) against a threshold. Switching between these two modes helps reduce power usage while maintaining accuracy in environments with constant magnetic fields.

The innovations can be implemented as part of a method, as part of a computing system configured to perform the method (e.g., including systems that use computing resources external to the IMU, such as the cloud or a computing console separate from the IMU and the device to which the IMU is attached), or as part of computer-readable media storing computer-executable instructions for causing a processing device (e.g., a circuit, such as a microprocessor or microcontroller), when programmed thereby, to perform the method. The computer-readable media do not include carrier waves or signals per se. The various innovations can be used in combination or separately. The foregoing and other objects, features, and advantages of the invention will become more apparent from the following detailed description, which proceeds with reference to the accompanying figures.

DETAILED DESCRIPTION

I. General Considerations

Figure 1:
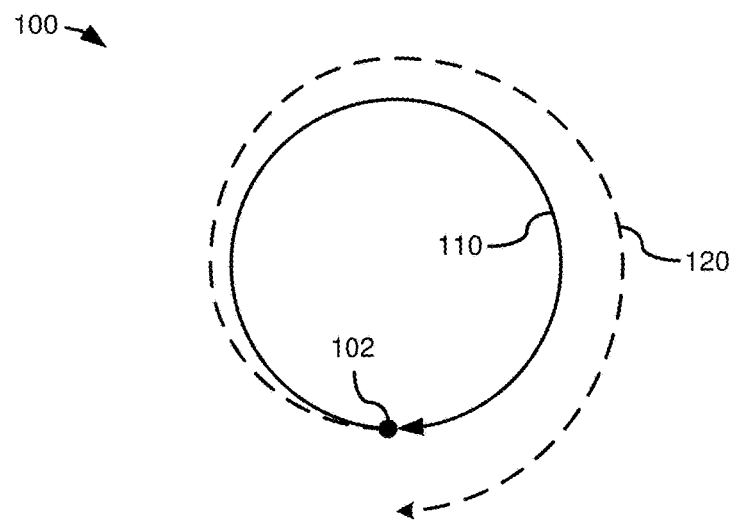
FIG. 1 is a schematic block diagram illustrating the loop closure problem commonly experienced by inertial measurement units.

Disclosed below are representative embodiments of methods, apparatus, and systems for determining position, movement, and/or acceleration of a device (e.g., an inertial measurement unit) using magnetic field measurements obtained from an array of magnetometers. The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "evaluate" to describe the disclosed technology. These terms are high-level abstractions of the actual operations that are performed. The actual operations that correspond to these terms may vary depending on the particular implementation and are readily discernible by one of ordinary skill in the art.

Various alternatives to the examples described herein are possible. For example, some of the methods described herein can be altered by changing the ordering of the method acts described, by splitting, repeating, or omitting certain method acts, etc. The various aspects of the disclosed technology can be used in combination or separately. Different embodiments use one or more of the described innovations. Some of the innovations described herein address one or more of the problems noted in the background. Typically, a given technique/tool does not solve all such problems.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase.

II. Introduction to the Disclosed Technology

Inertial measurement units (IMUs) are used to estimate orientation (rotation) and position (translation) with respect to an inertial frame (e.g., a coordinate system rigidly attached to the Earth). IMUs can comprise, for example, one or more gyroscopes, accelerometers, and/or magnetometers. A gyroscope is an IMU component that provides an estimate of angular velocity. In practice, a gyroscope's estimate contains errors. Integrating this estimate over time accumulates the errors without bound. In the absence of compensation, this error accumulation leads the IMU to report an ever increasing orientation error (e.g., an incorrect rotation with respect to the Earth), resulting in an undesirable drift effect.

As noted, IMUs are also used to estimate position in 3-D space. Typically, to detect motion (and hence position), the output of an accelerometer is double integrated, while compensating for rotations through the use of a gyroscope. Because both accelerometers and gyroscopes have estimation errors, the position estimate has an associated error. Due to the double integration that occurs to obtain position from acceleration, the position error accumulates over time without bound such that, if it is not compensated, it eventually makes the position estimate useless. This error accumulation is particularly obvious on inexpensive consumer-grade accelerometers and gyroscopes, which drift to unusable estimates on the timescale of, for instance, tens of seconds or (at best) a few minutes.

Position and orientation drift lead to the so-called "loop closure problem". This is a scenario where an IMU describes a movement in space characterizing a closed loop—starting and ending in the same location and facing the same direction. Due to IMU drift, however, the system's own estimate of position will diverge from the true position with time, such that the estimated final position does not coincide with the starting position. Likewise, the system's own estimate of orientation diverges from the true orientation with time, and the estimated final orientation does not coincide with the starting orientation.

FIG. 1 is a schematic block diagram 100 illustrating the loop closure problem. FIG. 1 is a top-down plan view of a real path 110 actually traversed by an IMU 102. Due to IMU drift, however, the path reported by the IMU is path 120, which increasingly diverges from the true path 110 as the errors in position estimates accumulate and are further compounded by the double integration that is performed to retrieve position data from acceleration data.

To compensate for angular sensor drift, IMUs can use the gravity vector and the Earth's magnetic field vector as absolute references. By assuming the gravity vector is a fixed reference (always points towards the center of the Earth) and the magnetic vector is also a fixed reference (always points to magnetic north), this nonexistent rotation can be detected and eliminated from the final results.

In many environments, however, the magnetic field is not constant and does not always point towards magnetic north. This is especially true for indoor environments, which are subject to distortions due to the proximity of magnetic elements (e.g., structural steel and other ferromagnetic metals and alloys) and current-carrying elements (e.g., building wiring and electronics). This creates a major problem for IMUs (especially low-cost IMUs), often making them useless for orientation and navigation purposes.

Embodiments of the disclosed technology address IMU drift and are adapted for use in indoor environments (e.g., a building or other structure having surrounding walls and a ceiling). Certain embodiments use a magnetometer array and computation mechanism that are not only immune to the magnetic-field disturbances encountered in indoor environments, but use them advantageously as an additional source of information. Consequently, in certain embodiments, the assumption of a constant, uniform magnetic vector field is removed and replaced with the assumption of a spatially varying, non-uniform magnetic vector field. Further, the magnetometer arrays of the disclosed technology can be used to map the spatially varying magnetic vector field for a particular environment (e.g., an indoor environment, such as a building or other structure having surrounding walls and a ceiling) as the magnetometer array moves within the environment. In particular implementations, the Jacobian matrix is computed from the magnetometer measurements from the array and a map of the magnetic field vectors and their associated Jacobian values for the particular environment is produced. By using the map, drift can be further reduced, as it provides a reference from which position can be determined using the information-rich data available in the Jacobian matrix.

For an environment (e.g., an indoor environment) with significant magnetic field variations (e.g., with respect to magnetometer accuracy and noise), the use of the magnetometer arrays and a Jacobian-based map enables navigation using the magnetometer array alone—that is, without measurements from gyroscopes, accelerometers, or both gyroscopes and accelerometers. Because gyroscopes consume a significant amount of power in operation, the use of magnetometers alone can substantially reduce power consumption of the IMU and, for example, improve battery life, all while avoiding drift.

Further, for an environment (e.g., an indoor environment) with magnetic fields with low spatial variability, external magnetic sources (e.g., inductors or permanent magnets) can be used to increase tracking accuracy. Additionally, the gyroscope and accelerometer components can be selectively activated and deactivated for environments with low magnetic variability, providing an adjustable compromise between power consumption and accuracy.

III. Example Embodiments Using Jacobian Matrix Values

A. Example Magnetometer Arrays and Jacobian Computation Techniques

Figure 2:
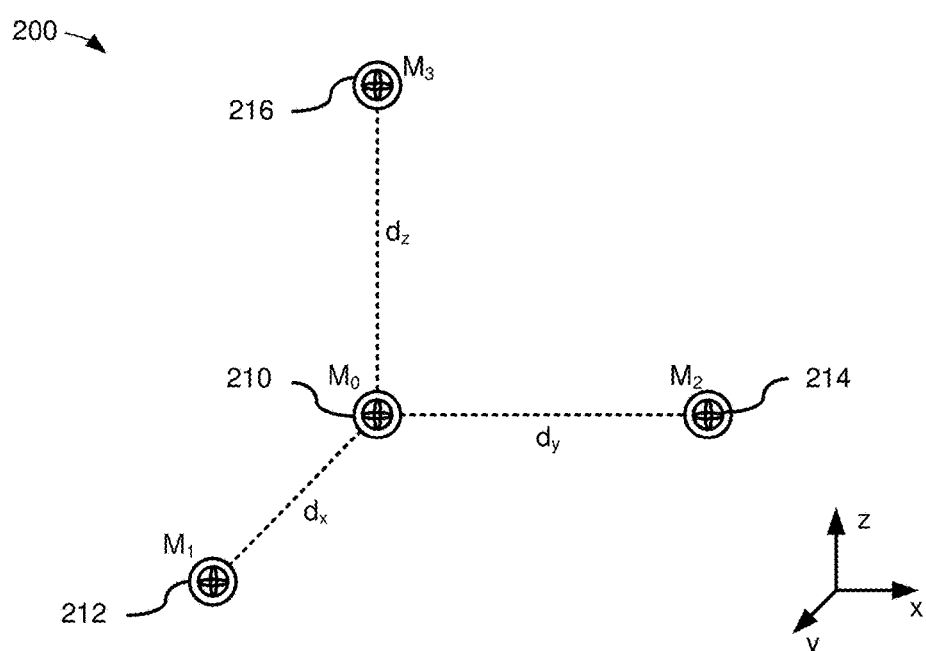
FIG. 2 is a schematic block diagram of a magnetometer array in accordance with embodiments of the disclosed technology.

FIG. 2 is a schematic block diagram of a magnetometer array 200 in accordance with embodiments of the disclosed technology. The array 200 shows four magnetometers 210, 212, 214, 216, respectively, spaced apart from one another along orthogonal x, y, and z axes in three-dimensional space. Thus, the magnetometers in FIG. 2 are said to be orthogonally spaced apart. In other embodiments, the magnetometers are not necessarily spaced apart orthogonally from one another but are spaced apart such that they are not collinear with one another. The distance by which the magnetometers are spaced apart can vary from implementation to implementation but is desirably enough to capture magnetic field differences in certain environments (e.g., indoor environments with non-uniform fields). In certain example implementations, the magnetometers are spaced part by at least 5 cm.

As more fully explained below, the magnetometer array is used to characterize spatial variations of the magnetic vector field. The magnetometers 210, 212, 214, 216 can be any of a variety of suitable magnetometers and may vary in size, sensitivity, sampling rate, etc., depending on the application. In particular example implementations, and without limitation, the magnetometers are low-noise magnetometers based on magneto-inductive technology that have a sensitivity of 100 nT or better (e.g., a sensitivity in the range of 1 pT-100 nT, and in some instances in the range of 1-10 nT, such as 10 nT) and a sampling rate of 60 Hz or greater (e.g., a sampling rate in the range of 10 Hz-10 kHz, and in some instances in the range of 60 Hz-240 Hz, such as 240 Hz). In the illustrated embodiments, the magnetometers 210, 212, 214, 216 comprise independent 3-axis magnetometers. In operation, each magnetometer can sample the magnetic field at its respective location along with the other magnetometers (e.g., simultaneous with the other magnetometers). In FIG. 1, magnetometer 210 can be referred to as the "reference" magnetometer, as it is illustrated as being located at the origin (or center) of the three-dimensional reference space defined by the array 200. Thus, the array 200 has reference magnetometer 210 at coordinates (0,0,0), magnetometer 212 at coordinates ($d_x$,0,0), magnetometer 214 at coordinates (0,$d_y$,0), and magnetometer 216 at coordinates (0,0,$d_z$).

In particular embodiments of the disclosed technology, the data from the magnetometers in the array 200 is used to compute estimates of the Jacobian of the magnetic field. In certain implementations, each of the magnetometers measures three individual magnetic field values, one each along the x, y, and z axes. For example, for magnetometer 210 ($M_0$), the three measured values at the magnetometer 210 can be represented as: $M_0^x$, $M_0^y$, and $M_0^z$, which together form the components of the magnetic field vector $\vec{M_0}$. Thus, the following measurements (shown as components for their corresponding vectors) are obtained by the magnetometers 210 ($M_0$), 212 ($M_1$), 214 ($M_2$), and 216 ($M_3$):

$$\vec{M_0}=(M_0^x,M_0^y,M_0^z) \quad (1)$$

$$\vec{M_1}=(M_1^x,M_1^y,M_1^z) \quad (2)$$

$$\vec{M_2}=(M_2^x,M_2^y,M_2^z) \quad (3)$$

$$\vec{M_3}=(M_3^x,M_3^y,M_3^z) \quad (4)$$

Using these measurements from the magnetometers, the following Jacobian matrix can be computed:

$$J = \left( \frac{\vec{M_1} - \vec{M_0}}{dx} \quad \frac{\vec{M_2} - \vec{M_0}}{dy} \quad \frac{\vec{M_3} - \vec{M_0}}{dz} \right) \quad (5)$$

Which can be expanded to:

$$J = \begin{pmatrix} \frac{M_1^x - M_0^x}{dx} & \frac{M_2^x - M_0^x}{dy} & \frac{M_3^x - M_0^x}{dz} \\ \frac{M_1^y - M_0^y}{dx} & \frac{M_2^y - M_0^y}{dy} & \frac{M_3^y - M_0^y}{dz} \\ \frac{M_1^z - M_0^z}{dx} & \frac{M_2^z - M_0^z}{dy} & \frac{M_3^z - M_0^z}{dz} \end{pmatrix} \quad (6)$$

As can be seen from Equation (6), the Jacobian matrix effectively describes magnetic field rates of change along each of the x-, y-, and z-directions. The Jacobian matrix shown in equation (6) above can be computed through a variety of methods, include by computing finite differences as illustrated.

In certain embodiments, a Kalman filter is used to process incoming the data from the magnetometers and is adapted to remove or reduce the noise that may be in the raw data from the magnetometers. The Jacobian matrix or some of its components can be represented as part of the state of the Kalman filter, and thus estimated by it. Alternatively, the Jacobian matrix can be estimated using independent methods and provided as a measurement input to the filter.

Notably, the Jacobian matrix of a magnetic field is symmetric about its diagonal and is a zero trace matrix (the sum of the diagonal is zero). As a result of these properties, not all nine values from the Jacobian matrix need be saved and used in further processing (e.g., in any of the location determination or map creation techniques disclosed herein). In particular, five values from the Jacobian matrix can be used recover to the full Jacobian matrix. For example, any of the diagonal values can be excluded, and any of the off-diagonal values can be excluded so long as a symmetrical off-diagonal value is retained.

Further, these five Jacobian matrix elements can be combined with the magnetic field measurements at each magnetometer to form a magnetic-field-and-Jacobian dataset at a particular sampling rate. For example, both the Jacobian matrix values (as in equation (6) above and potentially reduced as noted above) and the magnetic field measurements at each magnetometer of the array 200 can be continuously obtained and buffered into memory at a desired sampling rate for the magnetometers of the array.

This dataset can be buffered into memory and/or stored as part of or as a data structure used for further processing (e.g., for determining location and/or map creation as disclosed herein). In particular implementations, the dataset includes 12 magnetic field measurements (3 each from the four magnetometers) and 5 (or 9) Jacobian matrix elements for a total of 17 or 21 magnetic-field-related values. This arrangement is not limiting, however, as other datasets are also possible and can be used with embodiments of the disclosed technology. For instance, other numbers of Jacobian matrix elements between 5 and 9 can be stored. Still further, in certain embodiments, only some of the magnetic field measurements are included in the dataset (e.g., only the 3 measurements from the reference magnetometer at the origin (center) of the array. In still other embodiments, only Jacobian matrix elements are included in the dataset.

It should be noted that during the processing of the data from the magnetometers, one or more filters or filtering techniques can be applied to the data to account for potential noise inherent in the magnetometers and/or the array. For example, a suitable Kalman filter can be applied to the data as it is processed. For instance, a Jacobian can be modeled as a state variable of a Kalman filter, which then acts as a recursive least-squares estimator.

In FIG. 2, four magnetometers are illustrated. In other embodiments, however, additional magnetometers are included in the array (e.g., 6, 7, or more magnetometers).

In still other embodiments, the magnetometer array has only three magnetometers (each being capable of measuring respective x, y, and z magnetic field values, as explained above). For example, when the magnetometer array is included as part of a generally flat or two-dimensional system (such as a tablet computer, smart phone, or other generally flat system). In such embodiments, it is still possible to obtain a full Jacobian matrix by using the symmetric and zero trace qualities of the Jacobian matrix. As an example, consider a magnetometer array that is similar to magnetometer array 200 but is missing the magnetometer $M_3$ located along the z arm of the array. In such a case, the Jacobian matrix elements from Equation (6) that can be obtained from the measured values at $M_0$, $M_1$, and $M_2$ would be:

$$J = \begin{pmatrix} \frac{M_1^x - M_0^x}{dx} & \frac{M_2^x - M_0^x}{dy} & - \\ \frac{M_1^y - M_0^y}{dx} & \frac{M_2^y - M_0^y}{dy} & - \\ \frac{M_1^z - M_0^z}{dx} & \frac{M_2^z - M_0^z}{dy} & - \end{pmatrix} \quad (7)$$

Where the "-" indicates the missing value. By applying the symmetry and zero-trace properties of the Jacobian matrix, however, the missing values can be obtained. For example, and using the existing values shown in Equation (7), the missing values would be:

$$J = \begin{pmatrix} \frac{M_1^x - M_0^x}{dx} & \frac{M_2^x - M_0^x}{dy} & \frac{M_1^z - M_0^z}{dx} \\ \frac{M_1^y - M_0^y}{dx} & \frac{M_2^y - M_0^y}{dy} & \frac{M_2^z - M_0^z}{dy} \\ \frac{M_1^z - M_0^z}{dx} & \frac{M_2^z - M_0^z}{dy} & -\left(\frac{M_1^x - M_0^x}{dx} + \frac{M_2^y - M_0^y}{dy}\right) \end{pmatrix} \quad (8)$$

Consequently, the disclosed techniques can be used to detect position in three dimensions for generally planar (or thin) devices that do not necessarily have a form factor that allows a three-dimensional magnetometer array as shown in FIG. 2 to be used. For instance, a three-magnetometer array can be included in a tablet computer or smart phone where the z dimension is typically limited and constrained.

Figure 3:
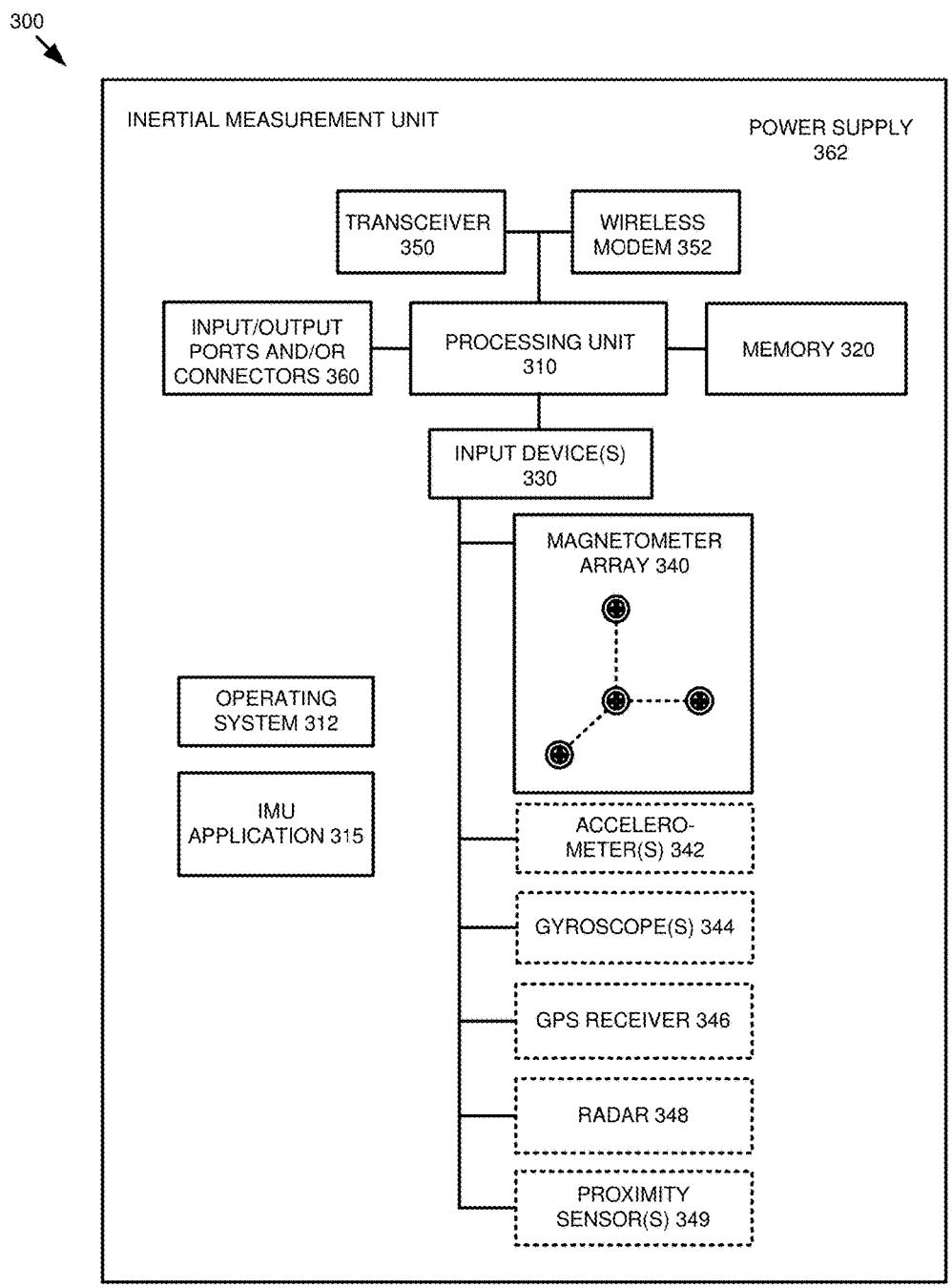
FIG. 3 is a schematic block diagram depicting an example of an inertial measurement unit (IMU) capable of implementing embodiments of the disclosed technology.

The magnetometer array 200 can be used in a variety of environments, including as part of an IMU that itself may be incorporated into a larger system. FIG. 3 is a schematic block diagram depicting an example of an inertial measurement unit (IMU) 300 capable of implementing embodiments of the disclosed technology. The IMU 300 includes a variety of optional hardware and software components. In general, a component in the IMU 300 can communicate with any other component of the IMU, although not all connections are shown, for ease of illustration. The IMU can be incorporated into or used with a variety of other systems, such as a virtual reality headset, a tablet computer, a smart phone, a laptop computer, a vehicle adapted for use in indoor environments (e.g., a terrestrial drone, a flying drone, a warehouse vehicle, etc.), or other such commercial or consumer device that is used in indoor environments.

The illustrated IMU 300 includes a processing device 310 (e.g., a circuit such as a computer processor unit (CPU), microprocessor, microcontroller, ASIC, FPGA, or other control and processing logic circuitry) for performing such tasks as data processing (e.g, computing Jacobian as disclosed herein), input/output processing, power control, signal coding, and/or other functions. An operating system 312 controls the allocation and usage of the components and support for one or more application programs 314, such as an IMU application 315 that implements one or more of the innovative features described herein. In some embodiments, the processing device 310 is a specialized integrated circuit, such as an ASIC or FPGA, configured to perform the IMU operations according to any of the disclosed embodiments.

The illustrated IMU 300 further includes memory/storage 320. Memory/storage 320 can include RAM, ROM, flash memory, nonvolatile RAM, a hard disk, or other such memory storage technologies. The memory/storage 320 can be used for storing data and/or code for running the operating system 312 and the application 315.

The illustrated IMU 300 operates using input from one or more input devices 330, which continuously provide the IMU with data that can be used to determine magnetic field values as well as velocity, acceleration, and/or orientation of the IMU (and/or the system or vehicle to which the IMU is attached). In the illustrated embodiment, the inputs devices 330 include magnetometers from a magnetometer array 340 as described above (e.g., a magnetometer array having 3, 4, or more magnetometers). The input devices 330 can optionally further include one or more accelerometers 342, gyroscopes 344, and/or a GPS receiver 346. In particular implementations, embodiments of the disclosed technology include a magnetometer array 340 of at least three (and, in some embodiments, four) magnetometers, one or more accelerometers 342 (e.g., a single 3-axis accelerometer), and one or more gyroscopes 344 (e.g., a single 3-axis gyroscopes). For instance, an IMU that is used for a device or system having a planar or substantially planar form factor (e.g., a tablet computer, smart phone, or other device having a housing with two relatively large dimensions (e.g., >5 cm) but a relatively small third dimension (e.g., <5 cm)) can have three magnetometers, while an IMU that is used in a device or system having a more three-dimensional form factor (e.g., a vehicle, VR headset, or other device having a housing in which all three dimensions are large enough to accommodate a four magnetometer array (e.g., a housing in which the x, y, and z dimensions are >5 cm) can have four or more magnetometers.

Other input devices 330 can also be included in the IMU 300. For example, the IMU can include a radar 348 (e.g., LIDAR, or LIDAR-like radar) and/or one or more proximity sensors 349. Such additional devices can be particularly useful when the IMU is attached to a vehicle (e.g., robot or drone) that is navigating in an indoor environment (e.g., a building or other structure having surrounding walls and a ceiling).

A wireless modem 352 can be coupled to one or more antennas (e.g., transceiver 350) and can support two-way communications between the processing device 310 and external devices, as is well understood in the art. The modem 352 is shown generically and can include, for example, a cellular modem for communicating at long range with a mobile communication network, a Bluetooth-compatible modem, and/or a Wi-Fi-compatible modem for communicating at short range with a local wireless data network or router.

The IMU 300 can further include at least one input/output port and/or connector 360, which may be any suitable connector to another component or system. For example, the ports/connectors 360 may be input/output pads on a printed circuit board (PCB) configured to communicate with other components on the board, or a USB port, IEEE 1394 (FireWire) port, and/or RS-232 port. For instance, the IMU 300 may be a component in a larger system, and the ports/connectors 360 can serve to provide communications to and/or from the IMU. In further embodiments, the IMU may not include a separate processing device 310 and memory 320, and may instead provide raw data from any of the input devices 330 directly to another components of a larger, which may then process, store, and/or otherwise use the data from the IMU 300 (e.g., using any of the disclosed techniques).

The illustrated components in FIG. 3 are not required or all-inclusive, as any of the components shown can be deleted and other components can be added.

Figure 4:
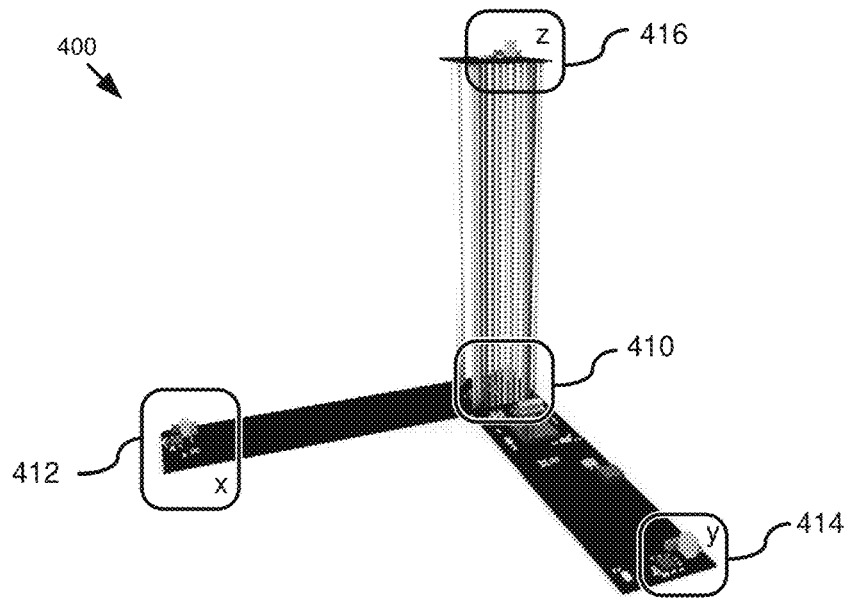
FIGS. 4 and 5 are renderings of an example IMU that includes a magnetometer array according to embodiments of the disclosed technology.
Figure 5:
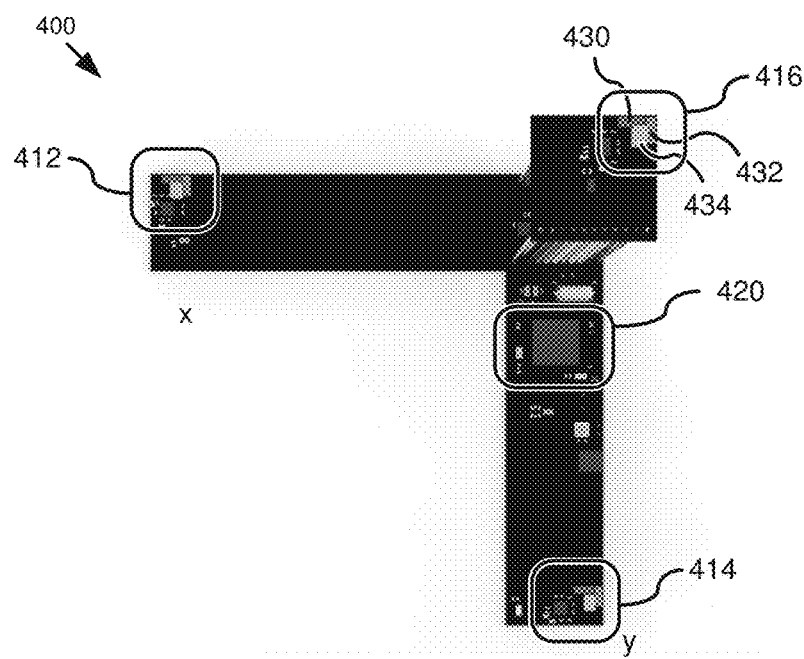

FIGS. 4 and 5 are renderings of an example IMU 400 that includes a magnetometer array according to embodiments of the disclosed technology. The size, dimensions, and arrangement in the illustrated IMU 400 are not to be considered limiting and are shown having exaggerated dimensions than would normally be used for a consumer or other practical application of the IMU. Nevertheless, the renderings in FIGS. 4 and 5 are useful in illustrating an IMU embodiment with certain ones of the components shown in FIG. 3. For instance, the IMU 400 includes a magnetometer array comprising four magnetometers 410, 412, 414, 416 arranged such that they are displaced from one another orthogonally in three dimensions (e.g., centrally and along the x, y, and z dimensions, respectfully) as described above with respect to FIG. 2. Also illustrated in FIGS. 4 and 5 is a microcontroller unit 420. In the illustrated embodiment, an accelerometer and a gyroscope (not visible) is also included with the IMU.

The magnetometers 410, 412, 414, 416 are themselves comprised of three individual magnetometer components that are oriented to measure the magnetic field in the x, y, and z directions of the IMU 400. For example, magnetometer 416 comprises an x-oriented magnetometer component 430, a y-oriented magnetometer component 432, and a z-oriented magnetometer component 434. The other magnetometers 410, 412, 414 include similar components arranged to measure the magnetic field along the x, y, and z axis at their respective locations.

The magnetometers 410, 412, 414, 416 are electrically coupled to the microcontroller 420 such that they provide data (e.g., raw x, y, z magnetic field measurement data from each respective magnetometer) to the microcontroller. The microcontroller 420 can be configured to receive the incoming data (e.g., simultaneously from all the magnetometers), compute the Jacobian matrix values (as explained below), and buffer (or store) the results. In particular embodiments, the microcontroller 420 may be further configured to arrange the data in a particular format (e.g., arrange in a dataset having a prescribed format and syntax, and/or other such further processing) and transmit the data to an external computer, which can then perform any of the location determination and/or map building techniques disclosed herein. In other embodiments, the microcontroller 420 can be configured to itself perform any of the location determination and/or map building techniques disclosed herein. In still other embodiments, certain operations are performed locally (e.g., location determination as disclosed herein using a locally downloaded magnetic-field-and-Jacobian map or using map information transmitted from an external computer) while other operations are performed remotely (e.g., magnetic-field-and-Jacobian map construction operations as disclosed herein).

In accordance with embodiments of the disclosed technology, the magnetic field Jacobian and the magnetic field measurements from the magnetometers (e.g., the raw magnetic field values from the magnetometer) can be used to estimate movement through the field. Notably, this movement estimation can be made independently of accelerometer and gyroscope derived estimates (though, in some embodiments, the estimation is made using accelerometer and/or gyroscope measurements as well). For instance, it can be shown that:

$$\dot{M} = \Omega \times M + J_m V, \quad (9)$$

where M is the magnetic field vector with respect to the body frame, $\dot{M}$ is its time derivative, $\Omega$ is angular rotation rate, $J_m$ is the Jacobian of the magnetic field in the body frame and V is the velocity projected onto the body frame.

When $J_m$ is non-singular, it can be shown that the velocity V can be estimated from measurements of the magnetic field and its Jacobian. In particular, the velocity produced by this method is obtained independently of the velocity estimated by integrating an accelerometer. Both estimates can be fused with a variety of methods (e.g., Kalman filters). A suitable adaptive algorithm estimates sensor errors and process noise (e.g., applied torques and forces), and uses a model of the system and its dynamics to optimally weigh sensor data and estimation methods. For example, in an environment where the magnetic field variability progressively diminishes, the estimation error for V using the expression above gradually increases, and an adaptive estimator may rely more on integrating accelerometer measurements.

In addition, and as more fully discussed below, one can use the magnetometer array 200 to aid in the creation of a magnetic-field-and-Jacobian map. Such a Jacobian-supplemented magnetic field map can be used to solve the loop closure problem and other related problems described below. To enforce the validity of the assumption of a spatially variable magnetic field (equivalently, of a field with non-singular Jacobian everywhere), and in certain implementations, external magnetic field generators can be used.

Figure 6A:
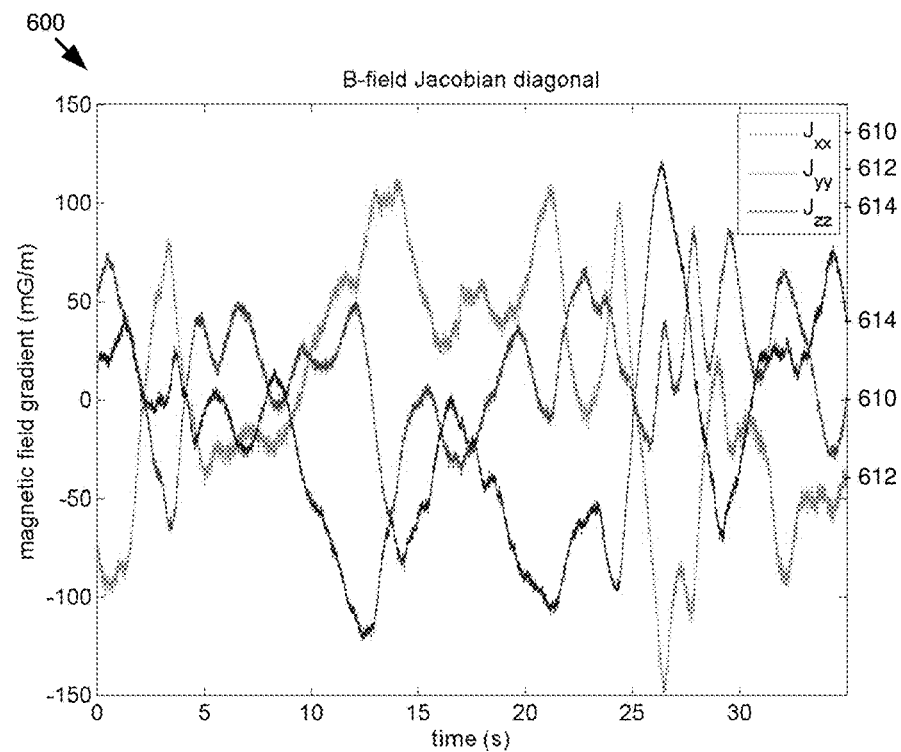
FIGS. 6A and 6B are graphs that illustrate the variability provided by the diagonal and off-diagonal elements of the magnetic field Jacobian matrix, computed from measurements of an example magnetometer array (having an arrangement in accordance with FIG. 2), while being carried by a pedestrian walking inside an office building.
Figure 6B:
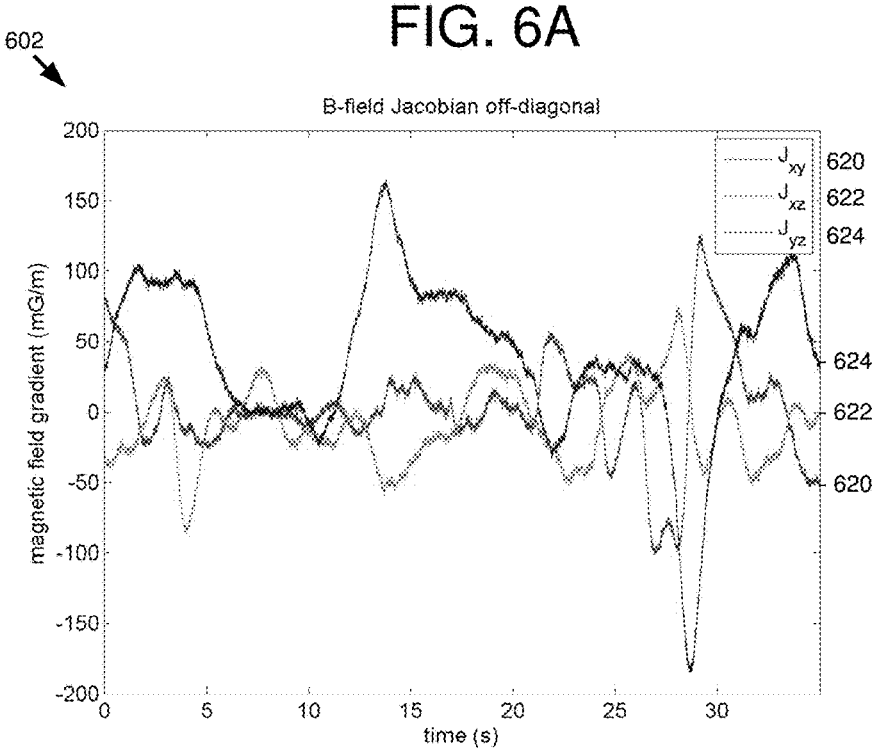

Due to the magnetic field variability that typically exists in indoor environments, the Jacobian matrix provides a significantly larger number of unique and widely varying data points that can be used to identify three-dimensional position within a particular space. FIGS. 6A and 6B, for example, are graphs 600, 602 that illustrate the variability provided by six of these Jacobian matrix values as measured by an example magnetometer array (having an arrangement in accordance with FIG. 2) and computed from the resulting magnetic field measurements. In particular, graph 600 includes plots 610, 612, 614 for the diagonal Jacobian elements shown above in Equation (6)

$$\left( \frac{M_1^x - M_0^x}{dx}, \frac{M_2^y - M_0^y}{dy}, \frac{M_3^z - M_0^z}{dz}, \text{respectively} \right),$$

and graph 602 includes plots 620, 622, 624 for the off-diagonal Jacobian elements shown in Equation (6)

$$\left( \frac{M_2^x - M_0^x}{dy}, \frac{M_3^x - M_0^x}{dz}, \frac{M_3^y - M_0^y}{dz}, \text{respectively} \right),$$

The measurements were obtained by walking around an indoor environment (an office building) while measuring magnetic field values and computing the associated Jacobians as in Equation (6). As can be seen, the plots 610, 612, 614 in FIG. 6A and plots 620, 622, 624 in FIG. 6B produce widely varying and unique sets of values due to the non-uniform nature of the magnetic field in a typical indoor environment.

Figure 7:
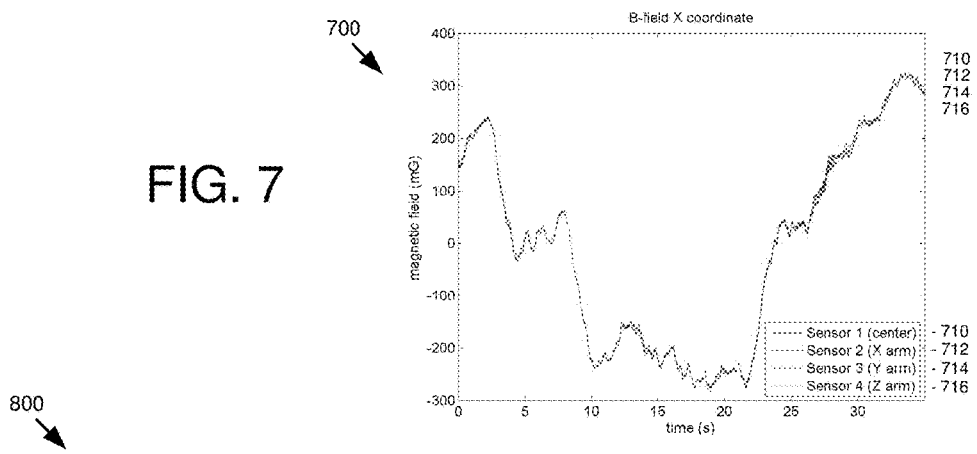
FIGS. 7, 8, and 9 are graphs of the magnetic field measurements from the x-, y-, and z-oriented magnetometer components of the example magnetometer array used in collecting the data for FIG. 6.
Figure 8:
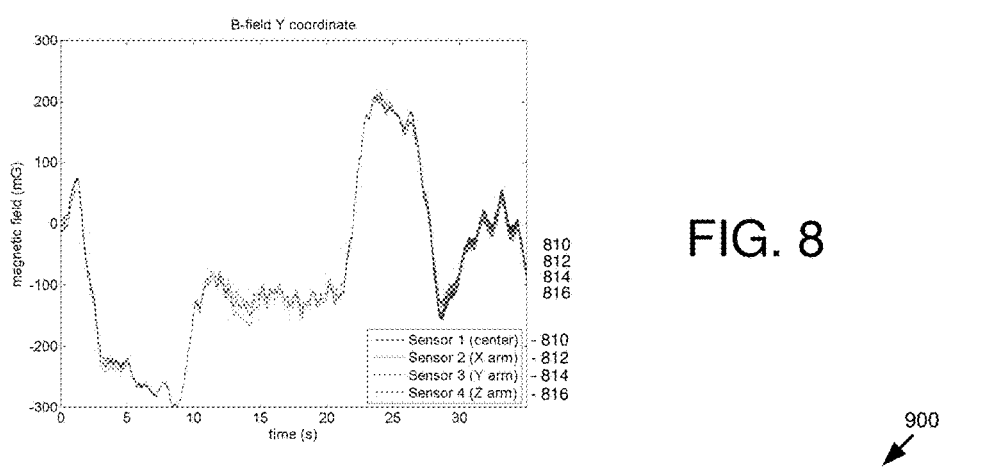
Figure 9:
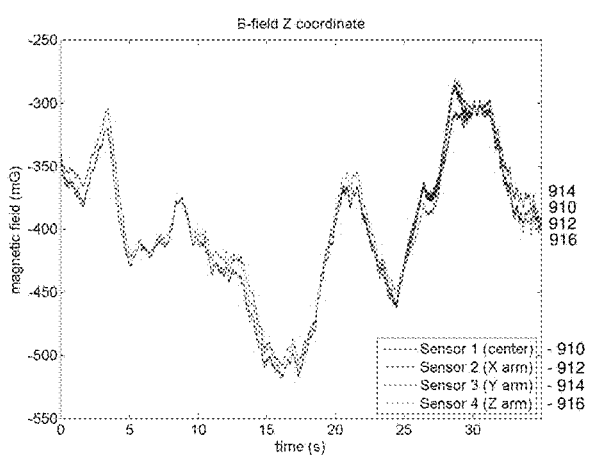

By contrast, FIGS. 7, 8, and 9 show graphs 700, 800, 900 of the magnetic field measurements from the x-, y-, and z-oriented magnetometer components of each of the four magnetometers in the example magnetometer array. In particular, graph 700 shows plots 710, 712, 714, 716 for the x-oriented magnetometer components from the center magnetometer 210, x-arm magnetometer 212, y-arm magnetometer 214, and z-arm magnetometer 216, respectively; graph 800 shows plots 810, 812, 814, 816 for the y-oriented magnetometer components from the center magnetometer 210, x-arm magnetometer 212, y-arm magnetometer 214, and z-arm magnetometer 216, respectively; and graph 900 shows plots 910, 912, 914, 916 for the z-oriented magnetometer components from the center magnetometer 210, x-arm magnetometer 212, y-arm magnetometer 214, and z-arm magnetometer 216, respectively. As can be seen in FIGS. 7-9, the plots have some differentiation, but not as much as the Jacobian values in FIG. 6.

B. Constructing and Using the Map of Magnetic Field and Jacobian Values

1. Introduction to Example Systems and Usage Scenarios

In certain embodiments of the disclosed technology, the magnetic field and associated Jacobian data are used to construct a map of the magnetic field vectors and their Jacobian over a prescribed region (e.g., the interior of a building). The resulting magnetic map can then be used to identify a magnetometer's position (and thus the position of its associated IMU or other device to which the IMU is attached (e.g., headset, vehicle, etc.)) in the mapped space (e.g., an indoor space).

The disclosed map construction and location determination techniques can be performed by a single computing entity or by computing resources internal to the system to which the IMU is attached (e.g., within the headset, vehicle, etc.) Alternatively, the construction and location determination techniques can be performed, at least in part, by computing resources external of the IMU.

Figure 10:
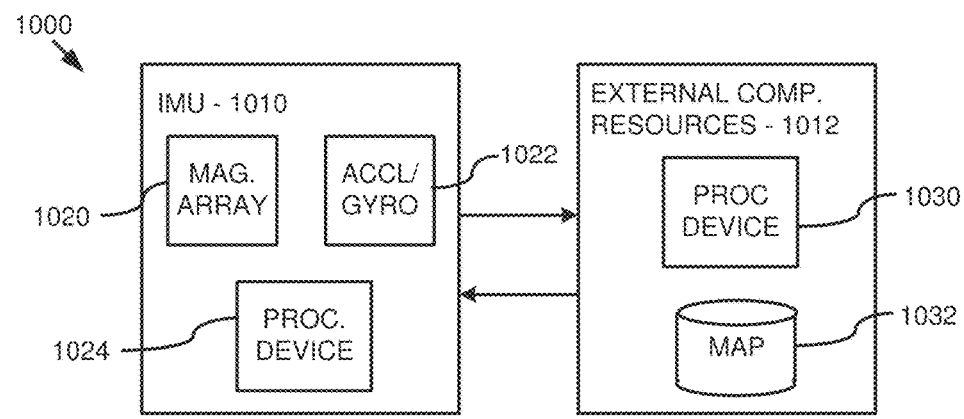
FIG. 10 is a schematic block diagram illustrating an example arrangement of an IMU that operates together with external computing resources to perform any of the disclosed map constructions and/or position determination techniques.

FIG. 10 is a schematic block diagram 1000 illustrating an example arrangement of an IMU 1010 that operates together with external computing resources 1012 to perform any of the disclosed map constructions and/or position determination (also referred to herein as "location fingerprinting") techniques. In FIG. 10, IMU 1010 can be an IMU as described above with respect to FIG. 3 and comprise a magnetometer array 1020 (e.g., any of the magnetometer arrays as disclosed herein), one or more accelerometers and/or gyroscopes 1022, and one or more processing devices 1024. In certain implementations, the one or more processing devices 1024 are configured to perform any one or more of the following: receive data from the magnetometer array 1020 and/or the accelerometers/gyroscopes 1022; compute one or more Jacobian matrix elements from the magnetic field measurements received from the magnetometer array 1020 (e.g., any two columns of the Jacobian matrix, allowing the entire matrix to be derived as described above); compute a motion (or position) estimate from the data obtained from the accelerometer/gyroscope; perform any filtering for the data; arrange the data (either the raw measured data or filtered data) into a dataset having a prescribed format; transmit the dataset to the external computing resources 1012; receive a response from the external computing resources 1012; and/or perform further processing based on the received response (e.g., refining the movement (or positional) estimation made by the IMU and/or use the received data for a particular application supported by a system in which the IMU is used (such as computing and/or rendering images showing a new position in a virtual environment using the received positional data).

In FIG. 10, the external computing resources 1012 can be computing hardware located in a system external to the IMU 1010 and also external to the device (or system) to which the IMU 1012 is attached (e.g., external to the vehicle, headset, or other such system to which the IMU is attached). For instance, the external computing resources 1012 can be an external but locally located computing system (such as a gaming console) with which the IMU 1010 communicates (via a local wireless (e.g., WiFi or Bluetooth) or LAN connection) or can be a remote computing system (such as one or more cloud computing resources) with which the IMU communicates (via a wireless connection (e.g., a cellular connection) or WAN connection that includes the internet).

In FIG. 10, the external computing resources 1012 include one or more processing devices 1030 and a memory or storage device 1032 that updates and maintains the map of magnetic field vectors and associated Jacobian matrix elements in accordance with embodiments of the disclosed technology. In certain implementations, the one or more processing units 1030 are configured to perform one or more of the following: receive data from the IMU 1010; construct the map in accordance with any of the disclosed embodiments; compute an IMU's position in accordance with any of the disclosed embodiments; transmit positional results to the IMU 1010; and/or compute and transmit additional data supporting an application using the computed positional data (e.g., compute and potentially also render image data for a virtual environment at the new position of the IMU).

Figure 11:
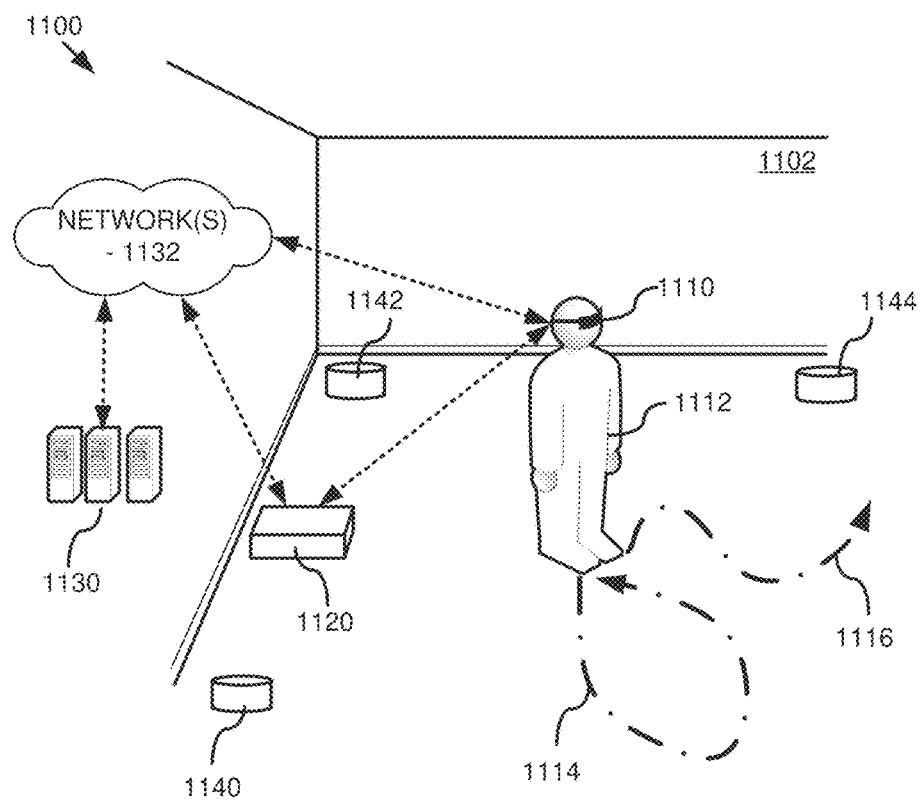
FIG. 11 is a schematic block diagram illustrating a particular example usage scenario that employs the use of an IMU and external computational resources as described in FIG. 10.

FIG. 11 is a schematic block diagram 1100 illustrating a particular example usage scenario that employs the use of an IMU and external computational resources as described above. In particular, FIG. 11 shows a usage scenario in which aspects of the disclosed technology are used in support of a virtual reality (VR) headset 1110 worn by a user 1112 who is traversing an indoor space 1102 (e.g., shown as closed-loop path 1114 and un-closed path 1116). The virtual reality headset 1110 includes an IMU having a magnetometer array as well as a set of accelerometers and/or gyroscopes as disclosed herein (e.g., as disclosed above with respect to FIG. 3). The VR headset 1110 further includes hardware resources (e.g., a processing device, memory and/or storage storing appropriate software, and/or communication hardware) for locally filtering measured data from the magnetometers and accelerometers/gyroscopes, computing Jacobian values, arranging and transmitting datasets with magnetic field and Jacobian values (potentially also with movement data from the accelerometers/gyroscopes) to external computing resources, and receiving resulting data from the external computing resources, as described above with respect to FIG. 10. In FIG. 11, the VR headset 1110 further includes hardware resources (e.g., display screen and associated optical and supporting graphic processing components) for displaying an image to a user (and potentially for rendering the image data into pixel data prior to display).

As can be seen in FIG. 11, the VR headset 1110 operates using external hardware resources as illustrated in FIG. 10. For instance, in particular embodiments, the VR headset 1110 wirelessly communicates (e.g., via a WiFi or Bluetooth connection) with a locally located but external computing system 1120 (e.g., a gaming console). The system 1120 can be configured to provide any of the map construction and location determination using a map services as disclosed herein, or can be configured to communicate with a remote computing resource in order to provide the map construction and/or location determination services. As illustrated, the remote computing resource can be a computing cloud 1130 accessible via a network 1132, which can include the internet. In certain embodiments, the external computing system 1120 operates as a router that provides a connection to the network 1132 via wireless communication with the VR headset 1110 but does not itself provide processing support for any of the disclosed methods. In other embodiment, the VR headset 1110 is configured to directly connect to the computing cloud 1130 without passing through the separate computing system 1120. For instance, the VR headset could wirelessly communicate with the computing cloud 1130 via an appropriate cellular or satellite connection.

Certain further operational features of the usage scenario illustrated in FIG. 11 will be explained in more detail in the sections below.

2. Map Construction

In certain embodiments, the magnetic field and associated Jacobian data as well as data indicating estimates of movement in a 3-D space (e.g., using information obtained from one or more accelerometers and/or one or more gyroscopes in the same system as the magnetometer array) are used to generate a three-dimensional map of the magnetic field vectors and their associated Jacobian values for a prescribed three-dimensional region (e.g., the interior of a building). The three-dimensional map (also referred to as a volumetric map) can comprise a data structure storing magnetic field data and associated Jacobian values in data structure entries that represent three-dimensional (cubic) volume elements of the mapped space. Thus, a position in the three-dimensional mapped space can have a corresponding entry in the data structure storing the map. The map of the magnetic field vectors and their Jacobian values can have a variety of spatial resolutions (e.g., cubic centimeters, cubic millimeters, or any other three-dimensional resolution). Further, the contents of the map can vary from embodiment to embodiment. For instance, in some embodiments, the three-dimensional map includes magnetic field data from all magnetometers of the magnetometer array along with one or more (e.g., all) Jacobian matrix elements; in other embodiments, the three-dimensional map has magnetic field data from fewer than all magnetometers of the magnetometer array (e.g., just the magnetic field values from the reference magnetometer) along with one or more (e.g., all Jacobian matrix elements); and in still other embodiments, the three-dimensional map has only Jacobian matrix elements (e.g., all Jacobian matrix elements or a subset thereof).

In certain implementations, the entries of the three-dimensional map of the magnetic field vectors and their associated Jacobian values further include a confidence value (e.g. noise standard deviation or variance) indicating how accurate the entry is. This sensor value can be derived from magnetic sensor errors (e.g., noise, nonlinearities and calibration inaccuracies) and the mismatch between the location where measurements took place and the location represented in the map (e.g., due to errors in position estimation, map construction or map representation). Over time, as the same space is traversed and overlapping measurements are gathered, the confidence value of the entries in the three-dimensional map can increase (e.g., the noise standard deviation reduced). When performing the location determination process, the confidence values can be used to determine the quality of the estimated location and to choose the most likely location from a list of candidates.

In particular implementations, a suitable transform (e.g., a harmonic decomposition or Fourier Transform) can be used to further decompose the magnetic field measurements. For example, man-made environments often have current-carrying elements generating time-varying magnetic fields at harmonics of the line frequency (typically 50 or 60 Hz). A Fourier Transform could be used to decompose magnetic field measurements into its contributions at 0, 60, 180 and 300 Hz. This decomposition can be helpful by removing interference from electrical systems (which would otherwise be measured as noise) and producing the DC (0 Hz) field. It can also add diversity to the magnetic map, since one can expect the fields at 60, 180 and 300 Hz—odd harmonics of 60 Hz—to be stronger in the neighborhood of electrical conduits and induction devices such as motors. The same processing and considerations above (computing the Jacobian and building a magnetic map) apply for each frequency of the decomposition. In effect, a decomposition at 0, 60, 180 and 300 Hz would produce 4 magnetic maps.

Further, in certain embodiments, spatial and temporal filtering (e.g., smoothing or averaging) can be used to reduce map noise, for example by updating the map every time a user visits a location. By comparing the confidence value stored in the map with the confidence value of each given user's hardware, a map update process can determine whether incorporating additional measurements is advantageous. For example, the magnetic measurements from multiple passes can be combined in a weighted average where the weighs are derived from noise figures. The map can be made particularly accurate if the same location is visited frequently by multiple users (e.g., individuals walking with IMU-equipped devices) while the map is generated and updated by a centralized computing resource (e.g., a server cloud or central local computer (e.g., a gaming console)).

Further, the three-dimensional map of the magnetic field vectors and their Jacobian values may have regions (e.g., volume elements) for which no magnetic field and Jacobian information were measured. In such cases, a physical model of magnetic fields (e.g., derived from Maxwell's equations, using that $\nabla \cdot B=0$ and $\nabla \times H=0$) can be used to construct a physically correct map. For instance, a field solver based on Maxwell's equations can be used to interpolate the expected data for the regions (e.g., volume elements) without actually observed data. This allows for the map to be complete and more useful for positional determination purposes. Over time, and as new measurement data becomes available from magnetometer-array-equipped IMUs traversing the space, the map can be refined based on the actual data observed. Thus, the three-dimensional map of the magnetic field vectors and their Jacobian values may include some inaccuracies due to interpolation during its early stages of construction, but gradually become more precise and physically accurate as new data is continuously received from magnetometer-array-equipped IMUs and used to update and refine the map.

During the magnetic map construction process, and in particular example implementations, the boundaries of the magnetic map can initially be confined to the observed measurements with some interpolated data (e.g., interpolated data for some number x of regions (volume elements) surrounding the observed data points). Eventually, the boundaries can be expanded to reach the boundaries of the indoor space the map represents (e.g., well-defined walls and doorways). These known boundaries can be used to assist in the building of the map.

As noted, estimating location in a three-dimensional space is one of the problems that certain embodiments of the disclosed technology are designed to solve. In the absence of the magnetometer array and Jacobian computations disclosed herein, a magnetic map construction and update process would rely on an independent, additional 3-D localization method. Such an independent localization method requires additional hardware and computations (e.g., cameras and computer vision processing algorithms, or radiofrequency beacons) that are not required (or even present) in embodiments of the disclosed technology. Instead, the magnetometer array and Jacobian computations of the disclosed technology can be used to "bootstrap" the process of building a map in locations of sufficient magnetic variability, thereby obviating a separate localization technology specifically used for map building. This is possible because the use of the Jacobian provides a better characterization of the magnetic field at each point. More specifically, the magnetic field by itself at a given point in space carries little information that could be used to identify its location; it effectively has 1 degree of freedom given by its intensity since the field's rotation is unknown a priori. By contrast, the Jacobian can carry significantly more information—a non-singular Jacobian contributes an additional 5 degrees of freedom (since it is a 3×3 symmetric matrix with zero trace). Thus, the combination of magnetic field and Jacobian provides features (data) that are significantly more effective for location fingerprinting.

The uniqueness provided by the Jacobian can be further improved by defining the feature vector for localization as a suitably long time series of the magnetic field, magnetic field Jacobian, and estimated position and angular displacements (e.g., produced by a Kalman filter). The time series length can be chosen to be sufficiently long as to carry a unique fingerprint of the location (measured over a path), while short enough that IMU drift is not an impairment. The required length of the time series depends on the magnetic field diversity over the trajectory traversed, the size of the map it is matched against, and/or the resolution of both the instrumentation and of the map measurements. For example, considering each element of the Jacobian matrix can be represented with 20 levels of resolution (achievable with the device used to produce FIGS. 6A and 6B) and each of the 5 degrees of freedom of the Jacobian fills half of its dynamic range (10 levels), a single sample of the Jacobian carries $10^5 \approx 100$ thousand possible combinations. Over normal human walking speeds, a Jacobian sample can be easily produced every 1 second. Assuming every new sample produces 1 bit of information for each of the 5 degrees of freedom, a time series of N seconds can represent $10^5 \cdot 2^{5N}$ combinations, which quickly becomes a very large value. While these considerations assume a sufficiently variable magnetic field, they show that series with durations on the order of seconds can be used to fingerprint locations. The use of the Jacobian as a feature vector component allows the use of shorter time series with respect to a model that only uses the magnetic field vector, and relaxes requirements on the geometry of the path traversed in space by the IMU during the acquisition of the time series. A magnetic map can then be generated (for example) by stitching time sequences together, using statistical signal processing techniques. For example, in certain implementations, graph-based simultaneous localization and mapping (SLAM) techniques are used for map generation.

Figure 16:
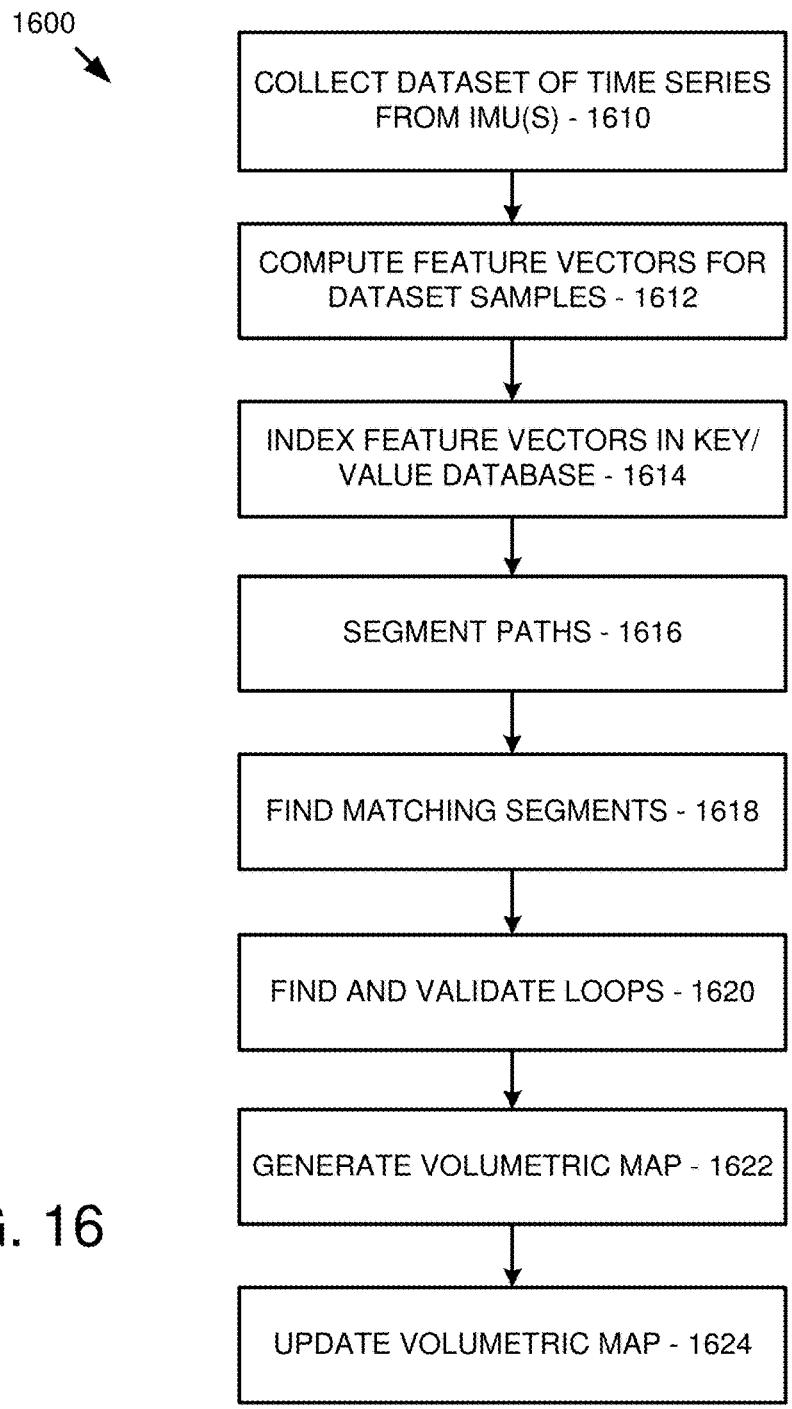
FIG. 16 is a flow chart showing an example method for map building and/or using the map.

An example map creation technique is shown in FIG. 16. In particular, FIG. 16 is a flow chart 1600 showing one example method for map building by path stitching. As discussed below, the technique in FIG. 16 can also be used to determine a current position of an IMU, and thus is not limited to map creation. The example method shown in FIG. 16 can be performed by a cloud computing system, computing resources that are locally located but separate from the IMU, or by computing resources of the IMU itself or attached to the device to which the IMU is attached. In certain implementations, the method 1600 is performed by a remote cloud computing system that is configured to receive data from multiple IMUs having magnetometer arrays as described herein according to any of the arrangements discussed above with respect to FIGS. 10 and 11. The particular embodiment illustrated in FIG. 16 should not be construed as limiting, as other methods for map building can also be used. Further, the disclosed method acts can be performed alone, in different orders, or at least partially simultaneously with one another. Further, any of the disclosed methods or method acts can be performed with any other methods or method acts disclosed herein.

At 1610, a dataset is collected (input) from one or more users travelling in an environment (e.g., an indoor environment, such as a building). The dataset can comprise a collection of time series. Each time series can be generated by a device having an IMU as described herein traversing a continuous path, and can contain samples from the IMU sensors at known sampling rates (e.g., samples from the magnetometer array as disclosed herein, accelerometer, and gyroscope). The dataset can be received from the IMU directly (e.g., wirelessly) or indirectly after being first received at a computing system local to the IMU. In some embodiments, a magnetic field Jacobian matrix is computed for each sample in the time series. In other embodiments, the magnetic field Jacobian matrix is computed by the IMU itself and part of the data received from the IMU. Relative linear and angular displacements are computed between consecutive samples, indicating how the device position and orientation changed. In this example, it is assumed that the dataset is sufficiently dense to have overlapping segments, with paths that intersect each other and may even self-intersect.

At 1612, feature vectors for dataset samples (e.g., for all dataset samples) are computed. For example, a sample feature vector represents the unique properties of the sample, while reducing or removing redundant or ambiguous characteristics. Many variations are possible for computing feature vectors for the dataset samples. In one example, the feature vector is determined by:

Applying a rotation to all sensor measurements such that gravity points in the direction of the versor z=(0,0,1) and the projection of $M_0$ onto the XY plane points in the direction of the versor x=(1,0,0). This eliminates the rotational ambiguity in the sample.

Computing the feature vector F=[$|M_0|$ is the $J_{11}$ $J_{12}$ $J_{13}$ $J_{21}$ $J_{22}$], where $|M_0|$ is the norm of the magnetic field at magnetometer #0 (the reference magnetometer), and $J_{11}, J_{12}, J_{13}, J_{21}, J_{22}$ are 5 elements of the magnetic field Jacobian, computed after the rotation described above, where the elements are identified using the notation below:

$$J = \begin{bmatrix} J_{11} & J_{12} & J_{13} \\ J_{21} & J_{22} & J_{23} \\ J_{31} & J_{32} & J_{33} \end{bmatrix}. \qquad (10)$$

At 1614, feature vectors are indexed into a key/value database. In practice, a large number of samples (e.g., millions or even billions of samples) may be involved in building a map. Iterating over the millions or billions of corresponding feature vectors F and comparing them against each other for similarity is computationally intractable. Many techniques in computer science have been developed to accelerate this search by hashing. Vector quantization, similarity preserving hash functions, and/or locality sensitive hash functions can be used to map feature vectors such that similar feature vectors map into the same identifier (informally called a "bucket") with high probability. Using a suitable hash function, and according to one example embodiment, the feature vectors from all samples are indexed in a key/value database (e.g., a hash table). In this example, the key is the hash of the feature vector, while the value is a pointer to the sample data structure in its parent time series.

At 1616, paths are segmented into segments (e.g., the continuous paths from respective IMUs are segmented). For example, the method 1600 can iterate over the collection of time series, splitting each time series into segments corresponding to a fixed temporal duration T and minimum linear displacement D (e.g., T=10 seconds and L>1 meter). In this example, T is desirably small enough to ensure small IMU drift, but large enough not to make this algorithm too computationally expensive. Larger values of L increase the probability of finding path intersections, and not having loose segments (whose location in the map cannot be determined, due to lack of intersections).

At 1618, intersecting segments (also referred to as matching segments) are found. For example, the method 1600 can: (1) define a weighed graph structure, where vertices are associated with segments, and edges connect segments with at least one similar sample/feature vector, where the edge weight represents the similarity and edges have a valid flag, initially set as false; and (2) populate the graph by, for each sample in each segment, finding matching samples in the database. The matching criterion may additionally include a maximum $l^2$ (Euclidean) distance between feature vectors.

At 1620, loops in the graph can be found and validated. For example, for every loop (cycle) in the graph, the corresponding path can be traversed and checked if its geometry corresponds to an actual physical loop with good approximation. If yes, edges in the loop (e.g., all edges in the loop) are marked as valid; if not, the edges are left with their previous status.

At 1622, the volumetric map is generated and stored (e.g., as a data structure stored at memory or storage device 1032). For example, for every vertex V in the graph whose edges are all valid, the magnetic field measurements corresponding to the segment to the map can be copied. If a connecting vertex is already on the map, the segment corresponding to V intersects it, and thus should be added to the map to make the location of this intersection physically accurate. This assumes that the entire dataset generates a connected graph.

If instead it generates a disconnected graph, each of its connected subgraphs creates a local map.

At 1624, the map can be updated with new data. For example, if new time series become available, the map can be updated by adding the new samples to the key/value database (method act 1614), segmenting the new time series (method act 1616), finding matches between the new segments and the database (method act 1618), checking if any of the new graph vertices form valid loops (method act 1620), and updating the map if new loops were added (method act 1622).

Figure 12:
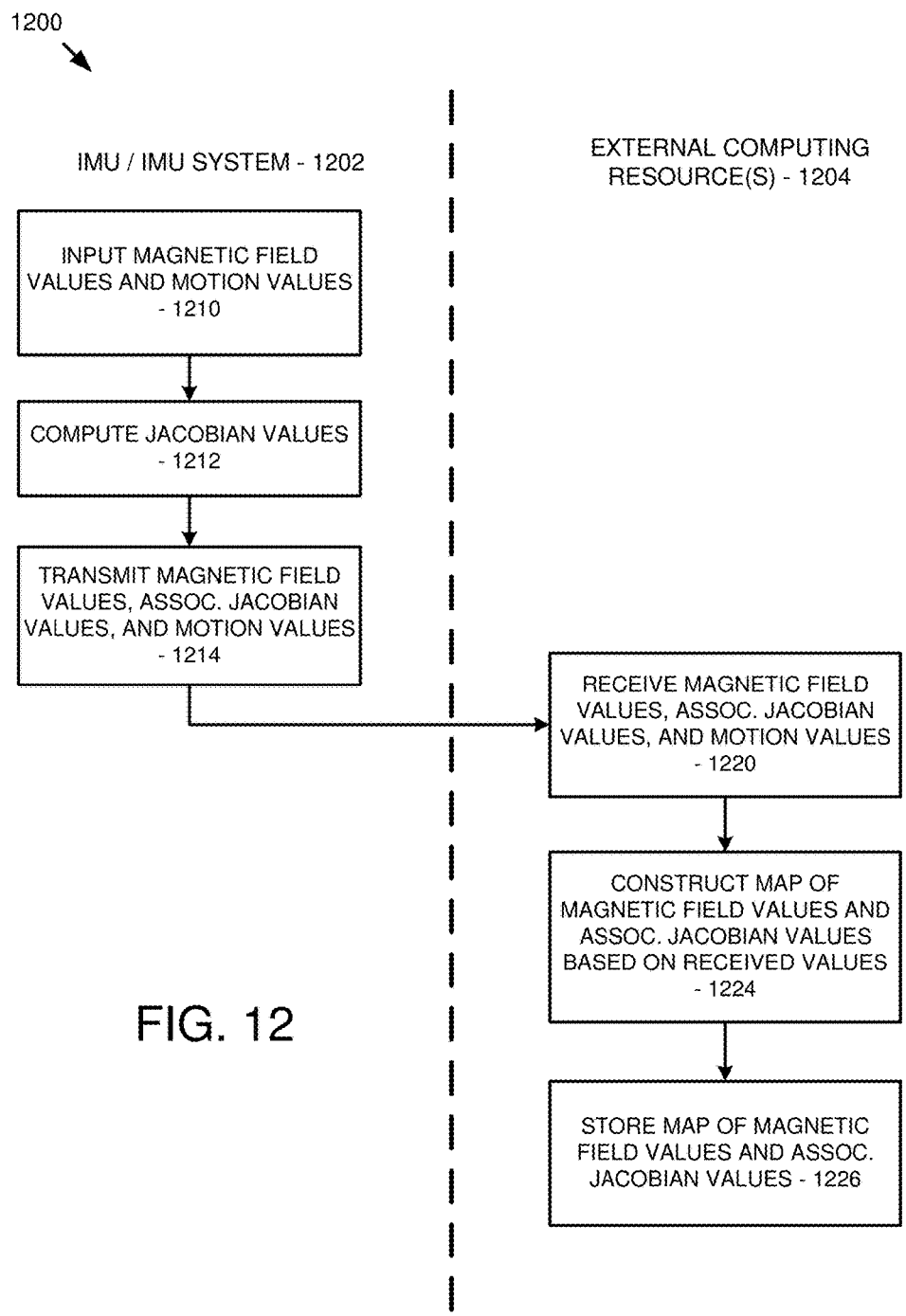
FIG. 12 is a flow chart showing one example method for constructing a three-dimensional map of the magnetic field vectors and their Jacobian values according to an embodiment of the disclosed technology.

FIG. 12 is a flow chart 1200 showing one example method for constructing a three-dimensional map of the magnetic field vectors and their Jacobian values according to the disclosed technology. As illustrated, the method can be performed in part by the IMU (or the system to which the IMU is attached) 1202 and in part by a separate external computing resource 1204 (e.g., a cloud computing system or a local (but external to the IMU and external to the system to which the IMU is attached) computing system (e.g., a gaming console)). The particular embodiment shown in FIG. 12 should not be construed as limiting, as the disclosed method acts can be performed alone, in different orders, or at least partially simultaneously with one another. Further, any of the disclosed methods or method acts can be performed with any other methods or method acts disclosed herein.

At 1210, magnetic field values as measured by the magnetometers of the magnetometer array of an IMU are input (e.g., buffered into memory or otherwise prepared for further processing). Also at 1210, IMU motion values as measured by the accelerometers and/or gyroscopes of the IMU are input. In certain embodiments, the accelerometer and gyroscope produce 3-axis linear acceleration (including gravity) and 3-axis angular velocity, respectively.

At 1212, Jacobian values are computed from the input magnetic field measurements. In this embodiment, the computations are performed by the local processing device of the IMU. The Jacobian values can be computed as described above (e.g., using Equation (6)). As noted, some of the Jacobian computations can be omitted since they can be derived later due to the symmetrical and zero-trace character of the Jacobian matrix.

At 1214, data for the magnetic field values (vector data) along with their associated Jacobian values are arranged and transmitted to the external computing resource (e.g., a gaming console or cloud computing system). For instance, for a magnetometer array having four magnetometers, a 17-value dataset can be transmitted to the external computing resource as explained above (12 values comprising magnetic field measurements from the individual magnetometers and magnetometer components (4 sets of 3 values each) and 5 Jacobian matrix elements) or a 21-value dataset when all Jacobian matrix elements are transmitted. For a magnetometer array having three magnetometers, a 15-value dataset can be transmitted to the external computing resource as explained above (9 values comprising magnetic field measurements from the individual magnetometers and magnetometer components (3 sets of 3 values each) and 6 Jacobian matrix elements) are transmitted. As noted, other-sized datasets can be assembled and transmitted as well.

Also at 1214, motion data for the IMU is transmitted to the external computing resource. The motion data can be the raw measurements from the accelerometers and/or gyroscopes of the IMU or can be motion data that is generated after local processing by the IMU. In the latter case, the motion data can indicate an estimate of motion (or position change) relative to the previous measurement in sequence. For instance, the motion data can be x-, y-, z-differences that indicate a positional change of the IMU from the previous measurements as estimated by the local IMU processing resources.

At 1220, the data for the magnetic field vectors and associated Jacobian values along with the motion data is received and input (e.g., buffered into memory or otherwise prepared for further processing) by the external computing resource.

At 1222, a map of the magnetic field vectors and associated Jacobian values is constructed based at least in part on the received data. For instance, any of the map construction techniques disclosed herein can be used to generate the map (e.g., the map construction technique of FIG. 16 discussed above). In particular embodiments, the received data is added to a sequential series of magnetic-field-and-Jacobian data that describes a path segment traversed by the IMU. For example, the motion data can be used to determine the positional changes experienced by the IMU, and thus the new direction of the path defined by the sequential series of data. This series of data can then be analyzed and correlated (or matched) to existing data in order to expand (or refine) the map that is generated and maintained by the external computing resources (e.g., as at 1624 in FIG. 16). As explained above, the external computing resources can be part of a remote computing system (e.g., the cloud) or part of a local computing system external and separate from the IMU (e.g., a gaming console).

At 1224, the map of the magnetic field vectors and associated Jacobian values is stored (e.g., as a data structure stored at memory or storage device 1032).

3. Map Usage

Once a three-dimensional map of the magnetic field vectors and their Jacobian values is constructed, it can be used to estimate position of the magnetometer-array-equipped IMU in the space (e.g., indoor space) described by the map. One desirable application of the map is to compensate drift and solve the loop closure problem illustrated by FIG. 1. For example, at every position, the IMU can compare the measured magnetic field and the map's magnetic field. If the map has relatively lower noise (and therefore is relatively more trustworthy), the IMU's estimate for position (e.g., based on the IMU's accelerometer and/or gyroscope measurements and/or magnetometer measurements) can be corrected to better fit the field described in the map, before the error accumulates. Thus, the map acts as a reference that allows the IMU to refine or correct its estimated position.

This is applicable to any scenario where a map can be used, including: (1) dead reckoning, where the user navigates long distances potentially with no loops; (2) movements within a small environment, where loop closure inevitably happens; and/or (3) no movement, where the map prevents drift by providing a reference the magnetometer array can lock on to.

A location fingerprinting approach similar to the one used to build the map can be used to locate a user. For example, the map may allow a magnetometer-array-equipped IMU to determine its location by first having the user traverse an arbitrary distance while recording (1) the variations of magnetic field measured by magnetometers of the array, and (2) the path traveled (estimated by the IMU using dead reckoning, e.g., with a Kalman filter), and then finding which corresponding path in the map has the highest correlation with the observed magnetic measurements. For example, the method acts performs during map creation can also be used to perform position determination (location fingerprinting). In one particular implementation, the method acts 1612-1620 of FIG. 16 are performed for the time series measured by the magnetometer-array-equipped IMU. This method finds where the one or more segments from the continuous path traversed by the IMU intersect the previously known segments. The resulting position at the end of the current segment can then be identified from the volumetric map and used to determine the IMU's position (e.g., as described below). In certain embodiments, the data from the IMU is then used to update the volumetric map (e.g., as at 1624).

Figure 13:
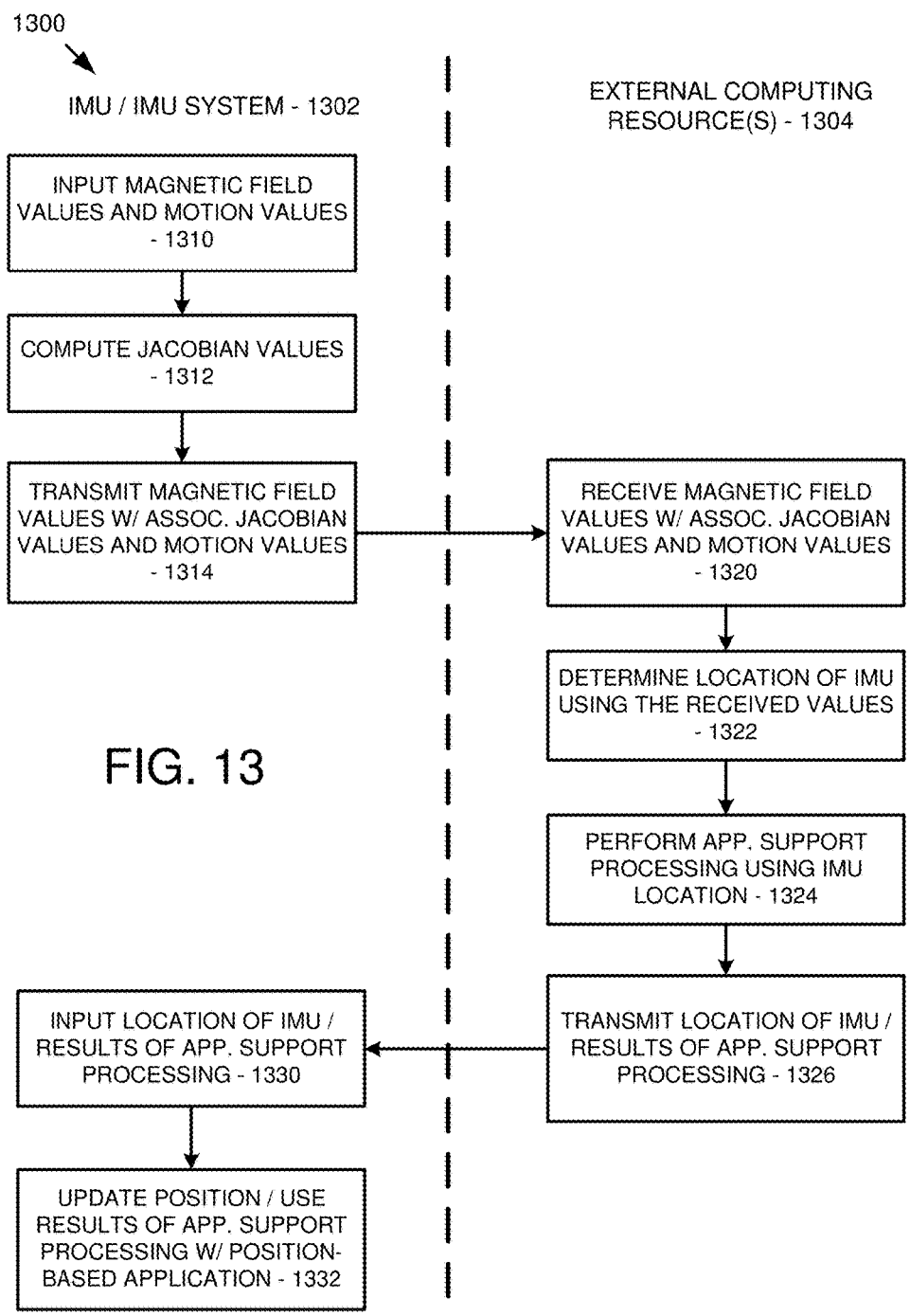
FIG. 13 is a flow chart showing one example method for performing location determination according to an embodiment of the disclosed technology.

FIG. 13 is a flow chart 1300 showing one example method for performing location determination (location fingerprinting) according to the disclosed technology. As illustrated, the method can be performed in part by the IMU (or by the system to which the IMU is attached) and in part by a separate external computing resource (e.g., a cloud computing system or a local (but external to the IMU and external to the device to which the IMU is attached) computing system (e.g., a gaming console)). The particular embodiment shown in FIG. 13 should not be construed as limiting, as the disclosed method acts can be performed alone, in different orders, or at least partially simultaneously with one another. Further, any of the disclosed methods or method acts can be performed with any other methods or method acts disclosed herein.

At 1310, magnetic field values as measured by the magnetometers of the magnetometer array of an IMU are input (e.g., buffered into memory or otherwise prepared for further processing). Also at 1310, IMU motion values as measured by the accelerometers and/or gyroscopes of the IMU are input.

At 1312, Jacobian values are computed from the obtained magnetic field measurements. In this embodiment, the computations are performed by the local processing device of the IMU. The Jacobian values can be computed as described above (e.g., using Equation (6)). As noted, some of the Jacobian computations can be omitted since they can be derived later due to the symmetrical and zero-trace character of the Jacobian matrix.

At 1314, data for the magnetic field values (vector data) along with their associated Jacobian values are arranged and transmitted to the external computing resource (e.g., a gaming console or cloud computing system). Datasets as described above can be assembled and transmitted. Also at 1314, motion data for the IMU is transmitted to the external computing resource. The motion data can be the raw measurements from the accelerometers and/or gyroscopes of the IMU or can be motion data that is generated after local processing by the IMU. In the latter case, the motion data can indicate an estimate of motion (or position change) relative to the previous measurement in sequence. For instance, the motion data can be x-, y-, z-differences that indicate a positional change of the IMU from the previous measurements as estimated by the local IMU processing resources.

At 1320, the data for the magnetic field vectors and associated Jacobian values along with the motion data is received and input (e.g., buffered into memory or otherwise prepared for further processing) by the external computing resources. As explained above, the external computing resources can be part of a remote computing system (e.g., the cloud) or part of a local computing system (e.g., a gaming console).

At 1322, a location of the IMU is determined from the received values using a map of the magnetic field vectors and associated Jacobian values (e.g., the map stored in memory or storage device 1032 and constructed according to any of the embodiments above). For example, the method acts of the map creation technique or a subset thereof (e.g., method acts 1612-1620 of FIG. 16 and discussed above) can be used to determine the position of the IMU. In particular embodiments, the received data is added to a sequential series of magnetic-field-and-Jacobian data that describes a path segment traversed by the IMU. For example, the motion data can be used to determine the positional changes experienced by the IMU, and thus the new direction of the path defined by the sequential series of data. This series of data can then be used to search for a closest matching series in the map. From the closest matching series, the current location of the IMU can be determined and appropriate positional data for the IMU's current position computed. For instance, the positional data computed can be three-dimensional relative positional data indicating a difference (or offset) in position from the last position or an absolute position relative to a fixed and known reference point. In conditions where a previous location of the IMU was known and the system is updating its position, the search for the closest matching series in the map can be constrained to a spatial neighborhood of the previous position.

At 1324, additional processing is performed to support an application being performed by the IMU. For instance, when the IMU is associated with a virtual reality headset, at least some of the resource intensive computations for supporting the VR headset can be performed by the external computing resources. As an example, at least some of the processing associated with computing and rendering an updated image of the virtual environment (updated to account for the new position of the IMU in real space, and thus also in the virtual space) can be performed by the external computing resources.

At 1326, the positional data, the results of the additional processing in support of the application at the IMU, or both the positional data and the results of the additional processing can be assembled and transmitted back to the IMU (or system associated with the IMU). When additional processing was performed at 1324, the results of the additional processing be assembled and sent to the IMU, either alone or with the positional data. For instance, image data (e.g., pixel data, compressed video data, or other form of encoded video data) representing images that account for the current position and orientation of the VR headset can be transmitted.

At 1330, the positional data, the results of the additional processing in support of the application at the IMU, or both the positional data and the results of the application supportive processing are received and input by the IMU (or system associated with the IMU).

At 1332, the positional data is used to update the position of the system to which the IMU is attached. For instance, the IMU may separately compute an estimate of position, which can then be updated (or refined) based on the received positional data. Further, the system to which the IMU is attached may use the positional data to perform computations associated with the application being performed by the system. For instance, when the IMU is associated with a VR headset, the positional data may be used by computing resources of the VR headset to compute, generate, and render updated image data that accounts for the current position and orientation of the headset within the virtual reality environment. In other embodiments, at least some of the processing for the application being performed by the system with the IMU is performed by the external computing resources and received at 1330. Thus, at 1332, results of the additional processing are used by the system as part of its intended application. For example, in embodiments in which the system to which the IMU is attached is a VR headset, the received data may include image data, as explained above. At 1332, the image data can be used to produce a display to the user of the virtual environment at the current location and orientation of the VR headset. In still other embodiments, and in situations where the map of the magnetic field vectors and their Jacobian values have sufficient variability, the location fingerprinting can be performed using the magnetic vector field and Jacobian values alone and without any further information provided by the accelerometer and gyroscope.

In one example embodiment, a variation of the technique illustrated in FIG. 16 and discussed above is used. In this embodiment, a segment is generated from the IMU measurements (as described above); for each sample in the segment, the most similar sample contained in the key/value database is found and the best match saved; and, if this best match is sufficiently close (e.g., if the distance between the IMU feature vector and the database feature vector satisfies a threshold value), then it is returned and used for position determination. This method tries to match each sample independently, instead of trying to match a segment. Additionally, one could match multiple samples of a segment by enforcing that corresponding locations on the map must not be farther apart than the user could have been able to move. A maximum travel velocity can be assumed. In this embodiment, the relative movements that define the 3-D trajectory of the path are not used to avoid requiring an accelerometer or gyro.

In some cases, it is sufficient to look for a match at only the end of the segment. Such a technique is suitable when: (1) the map is dense in the neighborhood of the end of the segment (e.g., given an end of segment location, the map is guaranteed to contain a measurement sufficiently close to it (such as within 10 cm or less, 5 cm or less, or some other predetermined threshold distance)); and (2) the feature vector for the sample at the end of the segment is sufficiently unique to allow its unambiguous identification (e.g., the database lookup doesn't produce multiple candidates). In practice, however, the map may have holes (no data) for certain locations. In these cases, one can perform a lookup for multiple samples in the segment in order to attempt to find at least one match. And if there are multiple matches, a constraint can be enforced that the matches describe the true path must be sufficiently close together to eliminate false positives. The best estimate for location would indeed be as close as possible to the end of the segment.

In another embodiment, the magnetometers are used to estimate both rotation and velocity. The results can then be used with a suitable path matching method (e.g., the method shown in FIG. 16 and discussed above). This can be done by simultaneously solving for $\Omega$ and V the following equations:

$$\dot{M}_0 = \Omega \times M_0 + J_m V \quad (11)$$

$$\dot{M}_1 = \Omega \times M_1 - J_m V \quad (12)$$

$$\dot{M}_2 = \Omega \times M_2 + J_m V \quad (13)$$

$$\dot{M}_3 = \Omega \times M_3 + J_m V \quad (14)$$

where $M_0, M_1, M_2, M_3$ are the magnetometer measurements.

Figure 14:
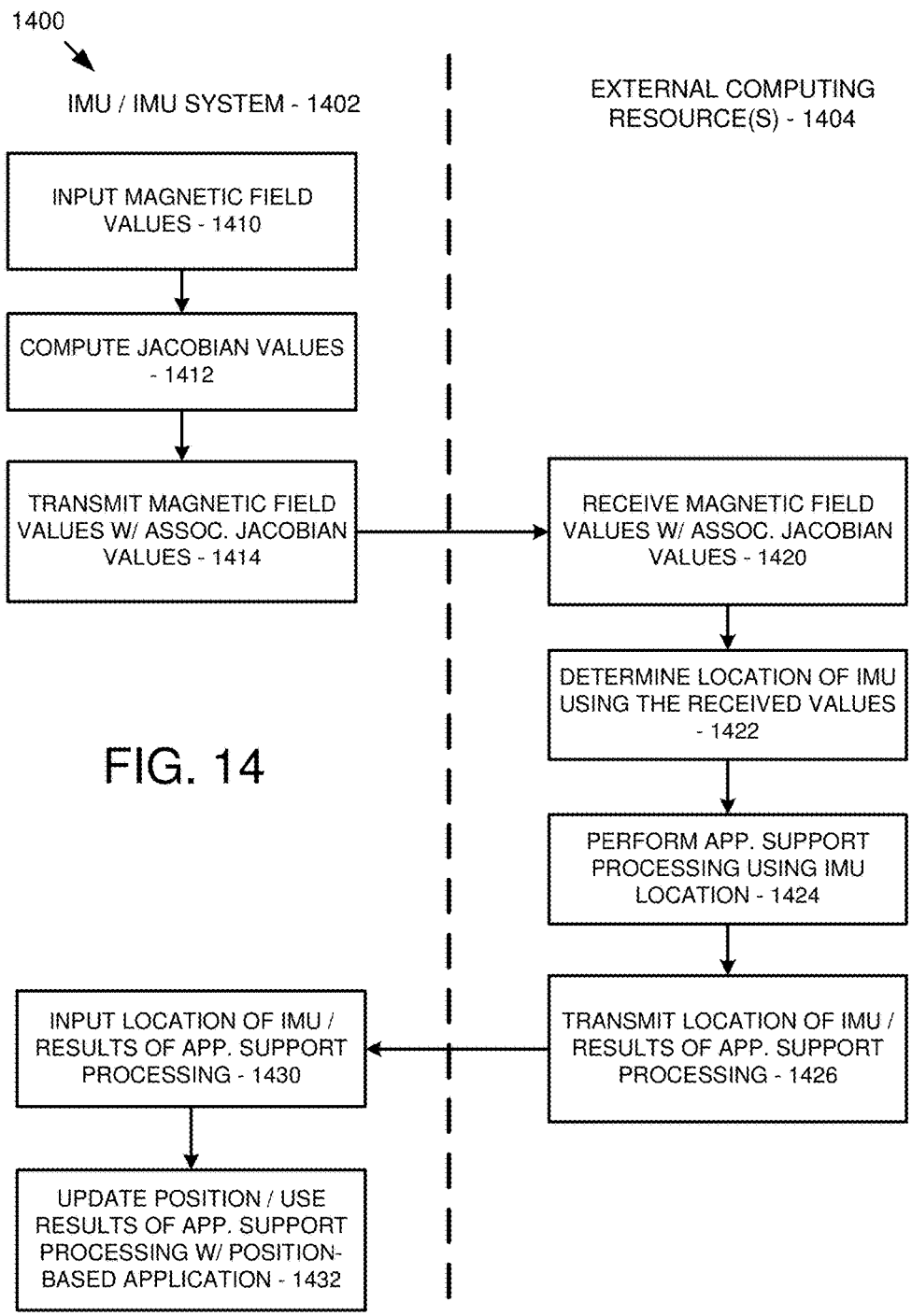
FIG. 14 is a flow chart showing another example method for performing location determination according to an embodiment of the disclosed technology.

FIG. 14 is a flow chart 1400 showing one example method for performing location determination (location fingerprinting) with magnetic field vector and associated Jacobian data alone (without additional data from a gyroscope and accelerometer of an IMU) according to the disclosed technology. As illustrated, the method can be performed in part by the IMU (or by the system to which the IMU is attached) and in part by a separate external computing resource (e.g., a cloud computing system or a local (but external to the IMU) computing system (e.g., a gaming console)). The particular embodiment shown in FIG. 14 should not be construed as limiting, as the disclosed method acts can be performed alone, in different orders, or at least partially simultaneously with one another. Further, any of the disclosed methods or method acts can be performed with any other methods or method acts disclosed herein.

At 1410, magnetic field values as measured by the magnetometers of the magnetometer array of an IMU are input (e.g., buffered into memory or otherwise prepared for further processing).

At 1412, Jacobian values are computed from the obtained magnetic field measurements. In this embodiment, the computations are performed by the local processing device of the IMU. The Jacobian values can be computed as described above (e.g., using Equation (6)). As noted, some of the Jacobian computations can be omitted since they can be derived later due to the symmetrical and zero-trace character of the Jacobian matrix.

At 1414, data for the magnetic field values (vector data) along with their associated Jacobian values are arranged and transmitted to the external computing resource (e.g., a gaming console or cloud computing system). Datasets as described above can be assembled and transmitted. In 1414, the magnetic field values and their associated Jacobians are sent alone without any further positional or movement data (such as any further data from an accelerometer and gyroscope).

At 1420, the data for the magnetic field vectors and associated Jacobian values is received and input (e.g., buffered into memory or otherwise prepared for further processing) by the external computing resources. As explained above, the external computing resources can be part of a remote computing system (e.g., the cloud) or part of a local computing system (e.g., a gaming console).

At 1422, a location of the IMU is determined using a map of the magnetic field vectors and associated Jacobian values (e.g., the map stored in memory or storage device 1032 and constructed according to any of the embodiments above). For instance, any of the example embodiment described above for performing location fingerprinting without any further information provided by the accelerometer and gyroscope can be used to determine the position of the IMU (e.g., using a subset of method acts from FIG. 16 or a variation of FIG. 16). In particular embodiments, the received data is added to a sequential series of magnetic-field-and-Jacobian data that describes a path segment traversed by the IMU. In this embodiment, no additional motion or positional data is used as part of this process. Instead, the magnetic field vectors and associated Jacobian values alone are used to assemble the series of consecutive measurements that are used to define the path segment traversed by the IMU. This series of data can then be used to search for a closest matching series in the map. From the closest matching series, the current location of the IMU can be determined and appropriate positional data for the IMU's current position computed. For instance, the positional data computed can be three-dimensional relative positional data indicating a difference (or offset) in position from the last position or an absolute position relative to a fixed and known reference point. For example, any of the position determination techniques described above can be used.

At 1424, additional processing is performed to support an application being performed by the IMU. For instance, when the IMU is associated with a virtual reality headset, at least some of the resource intensive computations for supporting the application used in the VR headset can be performed by the external computing resources. As an example, at least some of the processing associated with computing and rendering an updated image of the virtual environment (updated to account for the new position of the IMU in real space, and thus also in the virtual space) can be performed by the external computing resources.

At 1426, the positional data, the results of the additional processing in support of the application at the IMU, or both the positional data and the results of the application supportive processing can be assembled and transmitted back to the IMU (or system associated with the IMU). When additional processing was performed at 1424, the results of the additional processing be assembled and sent to the IMU, either alone or with the positional data. For instance, image data (e.g., pixel data, compressed video data, or other form of encoded video data) representing images that account for the current position and orientation of the VR headset can be transmitted.

At 1430, the positional data, the results of the additional processing in support of the application at the IMU, or both the positional data and the results of the additional processing are received and input by the IMU (or system associated with the IMU).

At 1432, the positional data is used to update the position of the system to which the IMU is attached. For instance, the IMU may separately compute an estimate of position, which can then be updated (or refined) based on the received positional data. Further, the system to which the IMU is attached may use the positional data to perform computations associated with the application being performed by the system. For instance, when the IMU is associated with a VR headset, the positional data may be used by computing resources of the VR headset to compute, generate, and render updated image data that accounts for the current position and orientation of the headset within the virtual reality environment. In other embodiments, at least some of the processing for the application being performed by the system having the IMU is performed by the external computing resources and received at 1430. Thus, at 1432, results of the additional processing are used by the system as part of its intended application. For example, in embodiments in which the system to which the IMU is attached is a VR headset, the received data may include image data, as explained above. At 1432, the image data can be used to produce a display to the user of the virtual environment at the current location and orientation of the VR headset.

C. Enhancing Magnetic Field Variability in the Mapped Environment

The methods discussed above generally assume that the magnetic vector field has a non-singular Jacobian. Described informally, this implies that the magnetic field has enough variability that neighboring points in the magnetic vector field map are different; the vector field is not substantially constant along any direction (and, in certain instance, not substantially constant in any direction, anywhere); and the field has measurable and spatially frequent deviations from magnetic north, or any other fixed direction. In many indoor environments, this is true (especially with highly accurate magnetometers). However, in applications where high localization accuracy is desired irrespective of building characteristics, one might wish to increase magnetic field variability on purpose. In certain embodiments of the disclosed technology, this is achieved by generating additional magnetic disturbances in the environment. For example, this is achieved by using coils driven with a known signal or by strategically positioning permanent magnets. These elements can be placed, for instance, in the corners of a room for which a magnetic map is desired (e.g., a living room). In FIG. 11, for example, three example magnetic devices 1140, 1142, 1144 are illustrated. The devices can comprise active devices (e.g., coils that when provided with power produce a magnetic field) or static devices (e.g., ferromagnetic units that can provide magnetic polarities that serve to warp the magnetic field in the environment in which they are located). The magnetic devices 1140, 1142, 1144 can produce opposite magnetic effects from one another to increase the magnetic variability.

In the presence of such magnetic elements, the same map construction and usage techniques as described above can still apply, but with greater accuracy due to the increased variability of the magnetic field (e.g., as strictly described, due to decreased condition number of the Jacobian matrix).

D. Reducing Power Using Jacobian-Based Magnetic Field Variability Metric

Exclusively using the magnetometer measurements for navigation involves using a magnetic field with a substantially non-singular Jacobian. In some scenarios (e.g., outdoors, or in large indoor environments with weakly or slowly varying magnetic fields), the Jacobian may be close to singular, reducing the effectiveness of the use of the Jacobian-based techniques disclosed herein. In this case, the system desirably uses a gyroscope (e.g., a gyroscope of the IMU) for positional determination. Conversely, in environments with diverse magnetic fields, the gyroscope becomes less important and may be used less frequently or not at all. In such environments, the gyroscope is desirably deactivated in order to save power (e.g., because gyroscopes may use >10× the power of a magnetometer).

In particular embodiments, a metric for measuring the variability of the Jacobian matrix (and thus its quality of positional discrimination) is used as a threshold (or condition) for determining when the gyroscope of the IMU can be deactivated. In certain embodiments, for instance, the condition number of a computed Jacobian matrix is used as the relevant metric. In particular example implementations, the condition number of a matrix is the ratio of its maximal and minimal singular values. As discussed below with respect to FIG. 12, when the condition number for a computed Jacobian matrix (or a plurality (n) of computed Jacobian matrices) is below a certain threshold number (e.g., 10), then the magnetic field can be determined to be sufficiently variable such that the gyroscope of the IMU can be deactivated and powered down (and thus its measurement no longer used for motion or positional estimation). In other embodiments, a different measure for determining magnetic field variability is used.

In other embodiments, the metric for measuring the variability of the Jacobian matrix (e.g., the condition number) can be used to provide other variable control of the obtained measurements. For instance, sampling rate, accuracy, and/or resolution can be controlled based on the metric (e.g., based on the condition number of the Jacobian matrix).

Figure 15:
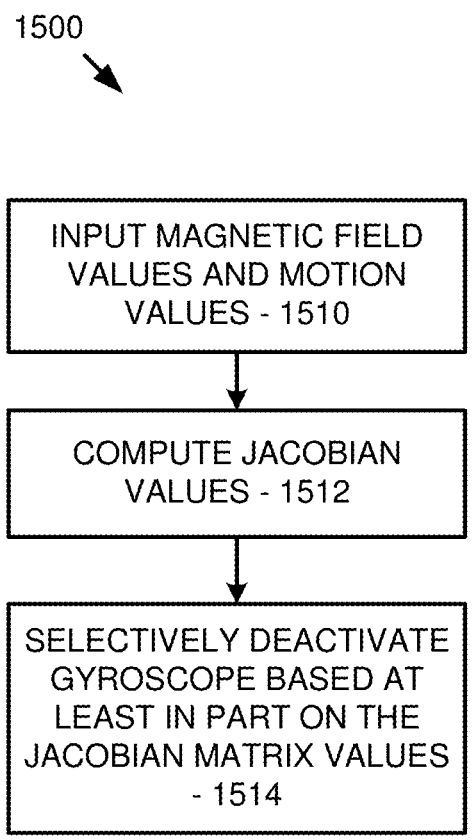
FIG. 15 is a flow chart showing an example method for controlling the power consumption of an IMU using Jacobian data according to an embodiment of the disclosed technology.

FIG. 15 is a flow chart 1500 showing one example method for controlling the power consumption of an IMU using Jacobian data according to the disclosed technology. The example embodiment shown in FIG. 15 should not be construed as limiting, as the disclosed method acts can be performed alone, in different orders, or at least partially simultaneously with one another. Further, any of the disclosed methods or method acts can be performed with any other methods or method acts disclosed herein.

In particular embodiments, the method is performed in a system that comprises a magnetometer array of at least three magnetometers and a gyroscope.

At 1510, magnetic field vector values from the magnetometers of the magnetometer array are input (e.g., buffered into memory or otherwise prepared for further processing).

At 1512, Jacobian matrix values are computed from the inputted magnetic field vector values. The Jacobian values can be computed as described above (e.g., using Equation (6)). As noted, some of the Jacobian computations can be omitted since they can be derived later due to the symmetrical and zero-trace character of the Jacobian matrix.

At 1514, the gyroscope is selectively deactivated (e.g., by sending an appropriate control signal that powers down the gyroscope) based at least in part on the Jacobian matrix values. For example, the selective deactivating of the gyroscope can be performed by determining whether a metric of magnetic field variability satisfies a threshold value. In particular implementations, the metric of magnetic field variability is the condition number for a Jacobian matrix computed from the magnetic field vector values. In general, the lower the condition number, the more varied the Jacobian matrix values. Thus, the gyroscope can be deactivated and powered down when the condition number meets or is less than a threshold value.

IV. Example Computing Environments

Figure 17:
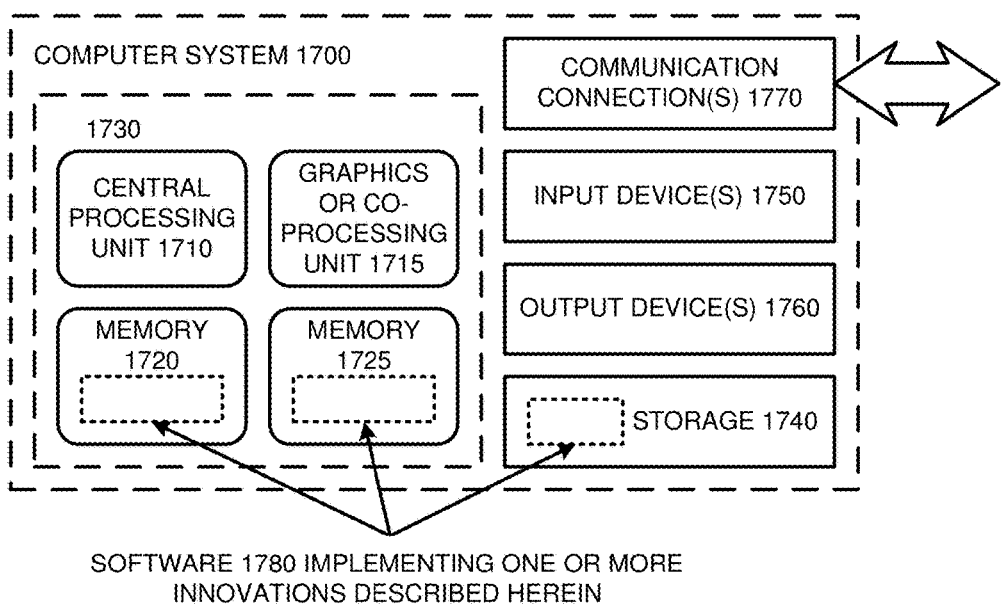
FIG. 17 illustrates a generalized example of a suitable computer system in which several of the described innovations may be at least in part implemented.

FIG. 17 illustrates a generalized example of a suitable computer system 1700 in which several of the described innovations may be implemented. The example computer system 1700 can be, for example, a computer system that is part of the IMU (or that operates in the system to which the IMU is attached) or a computer system in an external computing system that is configured to perform, at least in part, the map construction or position location services as disclosed (e.g., as part of a cloud computing system or gaming console) as described in the embodiments above. The computer system 1700 is not intended to suggest any limitation as to scope of use or functionality, as the innovations may be implemented in diverse general-purpose or special-purpose computer systems.

With reference to FIG. 17, the computer system 1700 includes one or more processing devices 1710, 1715 and memory 1720, 1725. The processing devices 1710, 1715 execute computer-executable instructions. A processing device can be a general-purpose CPU, GPU, processor in an ASIC, or any other type of processor. In a multi-processing system, multiple processing units execute computer-executable instructions to increase processing power. For example, FIG. 17 shows a CPU 1710 as well as a GPU or co-processing unit 1715. The tangible memory 17120, 1725) may be volatile memory (e.g., registers, cache, RAM), non-volatile memory (e.g., ROM, EEPROM, flash memory, NVRAM, etc.), or some combination of the two, accessible by the processing device(s). The memory 1720, 1725 stores software 1780 implementing one or more innovations described herein, in the form of computer-executable instructions suitable for execution by the processing device(s).

A computer system may have additional features. For example, the computer system 1700 includes storage 1740, one or more input devices 1750, one or more output devices 1760, and one or more communication connections 1770. An interconnection mechanism (not shown) such as a bus, controller, or network interconnects the components of the computer system 1700. Typically, operating system software (not shown) provides an operating environment for other software executing in the computer system 1700, and coordinates activities of the components of the computer system 1700.

The tangible storage 1740 may be removable or non-removable, and includes magnetic disks, magnetic tapes or cassettes, optical storage media such as CD-ROMs or DVDs, or any other medium which can be used to store information and which can be accessed within the computer system 1700. The storage 1740 stores instructions for the software 1780 implementing one or more innovations described herein.

The input device(s) 1750 may be a touch input device such as a keyboard, mouse, pen, or trackball, a voice input device, a scanning device, or another device that provides input to the computer system 1700. For video or image input, the input device(s) 1750 may be a camera, video card, TV tuner card, screen capture module, or similar device that accepts video input in analog or digital form, or a CD-ROM or CD-RW that reads video input into the computer system 1700. The output device(s) 1760 include a display device. The output device(s) may also include a printer, speaker, CD-writer, or another device that provides output from the computer system 1700.

The communication connection(s) 1770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations presented herein can be described in the general context of computer-readable media. Computer-readable media are any available tangible media that can be accessed within a computing environment. By way of example, and not limitation, with the computer system 1700, computer-readable media include memory 1720, 1725, storage 1740, and combinations of any of the above. As used herein, the term computer-readable media does not cover, encompass, or otherwise include carrier waves or signals per se.

The innovations can be described in the general context of computer-executable instructions, such as those included in program modules, being executed in a computer system on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computer system.

The terms "system" and "device" are used interchangeably herein. Unless the context clearly indicates otherwise, neither term implies any limitation on a type of computer system or computer device. In general, a computer system or computer device can be local or distributed, and can include any combination of special-purpose hardware and/or general-purpose hardware with software implementing the functionality described herein.

The disclosed methods can also be implemented using specialized computing hardware configured to perform any of the disclosed methods. For example, the disclosed methods can be implemented by an integrated circuit (e.g., an ASIC such as an ASIC digital signal processor ("DSP"), a GPU, or a programmable logic device ("PLD") such as a field programmable gate array ("FPGA")) specially designed or configured to implement any of the disclosed methods.

For the sake of presentation, the detailed description uses terms like "determine," "set," and "use" to describe computer operations in a computer system. These terms are high-level abstractions for operations performed by a computer, and should not be confused with acts performed by a human being. The actual computer operations corresponding to these terms vary depending on implementation.

V. Concluding Remarks

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

What is claimed is:

1. A system, comprising:
    a magnetometer array of at least three magnetometers arranged in a fixed configuration in which the magnetometers are spaced apart from one another; and
    one or more circuits being programmed or configured to:
        receive magnetic field vector values from each of the magnetometers in the magnetometer array; and
        compute Jacobian matrix values from the received magnetic field vector values.

2. The system of claim 1, wherein the one or more circuits are further programmed or configured to determine a current physical location of the magnetometer array in an indoor environment, the determination being based at least in part on the magnetic field vector values and the Jacobian matrix values.

3. The system of claim 2, wherein the determination of the current physical location of the magnetometer array is made using a three-dimensional map of magnetic field vector values and Jacobian matrix values in the indoor environment.

4. The system of claim 2, further comprising:
    one or more magnetic-field-altering elements placed within the indoor environment.

5. The system of claim 2, wherein the one or more circuits are programmed or configured to determine the current physical location of the magnetometer array in the indoor environment by:
    transmitting the magnetic field vector values and the Jacobian matrix values to an external computing system; and
    responsive to the transmitting, receiving positional data identifying the current physical position of the magnetometer array in the indoor environment from the external computing system,
    wherein the external computing system identifies the position of the magnetometer array in the indoor environment by identifying a position in a three-dimensional map of magnetic field vectors and associated Jacobian values in the indoor environment that corresponds to the magnetic field vectors and the Jacobian matrix values transmitted to the external computing system.

6. The system of claim 5, wherein the external computing system is a remote cloud computing system.

7. The system of claim 2, wherein the system further comprises an accelerometer and a gyroscope, and wherein the current physical location of the magnetometer array in the indoor environment is further determined at least in part by motion values from the accelerometer and the gyroscope.

8. The system of claim 7, wherein the one or more circuits are programmed or configured to determine the current physical location of the magnetometer in the indoor environment by:
    transmitting the magnetic field vector values, Jacobian matrix values, and the motion values to an external computing system; and
    responsive to the transmitting, receiving positional data identifying a position of the magnetometer array in the indoor environment from the external computing system,
    wherein the external computing system identifies the position of the magnetometer array by:
    assembling a series of magnetic field vectors and associated Jacobian values along a path traversed by the magnetometer array, the path being determined from the motion values, and
    determining the current physical location of the magnetometer array by identifying a series of magnetic field vectors and associated Jacobian values along a path of a three-dimensional map of magnetic field vectors and associated Jacobian values that corresponds to the assembled series.

9. The system of claim 1, wherein the Jacobian matrix values define magnetic field rates of change along each of the x-, y-, and z-directions.

10. The system of claim 1, wherein the one or more circuits are programmed or configured to compute fewer than nine Jacobian matrix values from the magnetic field vector values.

11. The system of claim 1, wherein the magnetometer array consists of three magnetometers.

12. The system of claim 1, wherein the magnetometer array and the one or more circuits are part of an inertial measurement unit (IMU), the IMU being affixed to a device.

13. The system of claim 12, wherein the device is a virtual reality headset.

14. One or more computer-readable media storing computer-executable instructions, which when executed by a computer cause the computer to perform magnetic map construction operations comprising:
    inputting magnetic field vector values and associated Jacobian matrix values, the magnetic field vector values being from an inertial measurement unit (IMU) traversing an indoor space, the inertial measurement unit comprising an array of spaced-apart magnetometers, the Jacobian matrix values being computed from the magnetic field vector values measured by the magnetometers; and
    constructing a three-dimensional map of magnetic field vectors and associated Jacobian values for the indoor space, the three-dimensional map of magnetic field vectors and associated Jacobian values being constructed at least in part from the inputted magnetic field vector values and associated Jacobian matrix values.

15. The one or more computer-readable media of claim 14, wherein the IMU is a first IMU, and wherein the constructing the three-dimensional map is performed using magnetic field vector values and associated Jacobian matrix values from one or more additional IMUs traversing the indoor space that are separate from the first IMU.

16. The one or more computer-readable media of claim 14, wherein the constructing the three-dimensional map of magnetic field vectors and associated Jacobian values comprises:

adding the inputted magnetic field vectors and associated Jacobian values to a sequential series of previously received magnetic field vectors and associated Jacobian values;

matching a portion of the three-dimensional map to at least a portion of the sequential series; and in response to the matching, updating the three-dimensional map using the magnetic field vectors and associated Jacobian values from the sequential series.

17. The one or more computer-readable media of claim 16, wherein the inputting further comprises inputting motion data along with the magnetic field vector values and associated Jacobian matrix values, the motion data being for a contemporaneous time period with the magnetic field vector values and the associated Jacobian matrix values and further being based on data obtained from one or more of an accelerometer or a gyroscope of the IMU.

18. A method, comprising:

by a circuit of an inertial measurement unit (IMU):

inputting magnetic field vector values from multiple magnetometers of a magnetometer array;

computing Jacobian matrix values from the inputted magnetic field vector values; and selectively deactivating a gyroscope of the IMU based at least in part on the Jacobian matrix values.

19. The method of claim 18, wherein the selectively deactivating the gyroscope comprises determining whether a metric of magnetic field variability in the Jacobian matrix values satisfies a threshold value.

20. The method of claim 18, wherein the metric of magnetic field variability comprises a condition number for a Jacobian matrix assembled from the Jacobian matrix values, and wherein the selectively deactivating is performed when the condition number meets or is less than the threshold value.

* * * * *